United States Patent
Chen et al.

(10) Patent No.: US 10,515,817 B2
(45) Date of Patent: Dec. 24, 2019

(54) METHOD FOR FORMING FEATURES OF SEMICONDUCTOR STRUCTURE HAVING REDUCED END-TO-END SPACING

(71) Applicant: Taiwan Semiconductor Manufacturing Company, Ltd., Hsinchu (TW)

(72) Inventors: Xi-Zong Chen, Tainan (TW); Yun-Yu Hsieh, Hsinchu (TW); Cha-Hsin Chao, Taipei (TW); Li-Te Hsu, Shanhua Township (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/028,496

(22) Filed: Jul. 6, 2018

(65) Prior Publication Data
US 2019/0103281 A1    Apr. 4, 2019

Related U.S. Application Data

(60) Provisional application No. 62/565,748, filed on Sep. 29, 2017.

(51) Int. Cl.
| | |
|---|---|
| *H01L 21/308* | (2006.01) |
| *H01L 21/768* | (2006.01) |
| *H01L 21/033* | (2006.01) |
| *H01L 21/311* | (2006.01) |
| *H01J 37/00* | (2006.01) |
| *H01L 21/3213* | (2006.01) |
| *H01L 21/3215* | (2006.01) |

(52) U.S. Cl.
CPC ......... *H01L 21/3086* (2013.01); *H01J 37/00* (2013.01); *H01L 21/0337* (2013.01); *H01L 21/0338* (2013.01); *H01L 21/3088* (2013.01); *H01L 21/31116* (2013.01); *H01L 21/31144* (2013.01); *H01L 21/76802* (2013.01); *H01L 21/32134* (2013.01); *H01L 21/32155* (2013.01)

(58) Field of Classification Search
None
See application file for complete search history.

(56) References Cited

U.S. PATENT DOCUMENTS

| | | | | |
|---|---|---|---|---|
| 5,567,640 | A * | 10/1996 | Tseng | H01L 27/10817 |
| | | | | 257/E21.648 |
| 6,368,973 | B1 * | 4/2002 | Tseng | H01L 21/76224 |
| | | | | 257/E21.546 |

(Continued)

FOREIGN PATENT DOCUMENTS

| | | |
|---|---|---|
| CN | 104658893 A | 5/2015 |
| TW | 201535643 A | 9/2015 |
| TW | 201537619 A | 10/2015 |

*Primary Examiner* — Allan W. Olsen
(74) *Attorney, Agent, or Firm* — Slater & Matsil, LLP

(57) ABSTRACT

A method includes forming a mask layer over a target layer. A first etching process is performed on the mask layer to form a first opening and a second opening in the mask layer. A second etching process is performed on the mask layer to reduce an end-to-end spacing between the first opening and the second opening. The first etching process and the second etching process have different anisotropy properties. A pattern of the mask layer is transferred to the target layer.

20 Claims, 27 Drawing Sheets

(56) References Cited

U.S. PATENT DOCUMENTS

| | | | |
|---|---|---|---|
| 2004/0166668 A1* | 8/2004 | Ito | H01L 21/76804 438/637 |
| 2007/0123031 A1* | 5/2007 | Isogai | H01L 28/91 438/624 |
| 2013/0196481 A1* | 8/2013 | Lee | H01L 21/0337 438/400 |
| 2014/0308788 A1* | 10/2014 | Lin | H01L 29/66719 438/268 |
| 2015/0111362 A1* | 4/2015 | Shieh | H01L 21/823431 438/424 |
| 2015/0147882 A1 | 5/2015 | Yao et al. | |
| 2015/0262873 A1 | 9/2015 | Chu et al. | |
| 2016/0274455 A1* | 9/2016 | Wei-De | G03F 1/36 |
| 2016/0379891 A1* | 12/2016 | Park | H01L 21/823475 257/401 |
| 2018/0090370 A1* | 3/2018 | Hung | H01L 21/31116 |

* cited by examiner

| Embodiments | 1 | 2 | 3 | 4 | 5 |
|---|---|---|---|---|---|
| Plasma ribbon beam profile |  |  |  |  |  |
| Parameters of etching apparatus | | | | | |
| RF frequency (kHz) | 5 to 10 | 1 to 5 | 1 to 5 | 5 to 10 | 5 to 10 |
| Duty ratio (%) | 10 to 40 | 0 to 10 | 50 to 80 | 10 to 40 | 10 to 40 |
| Ter angle (degree) | 0 | 0 | 0 | 90 | 15 |
| Distance $D_3$ (mm) | 20 to 30 | 15 to 20 | 20 to 30 | 15 to 20 | 15 to 30 |
| Gas flow (sccm) | 80 to 100 | 50 to 80 | 30 to 50 | 80 to 100 | 80 to 100 |

| Embodiments<br>IMP1 Parameters | Embodiment 1 | Embodiment 2 | Embodiment 3 |
|---|---|---|---|
| Ion Material | Boron/Phosphorus/Arsenic/Gallium/Indium | | |
| Energy (kJ) | 20 to 25 | 20 to 25 | 25 to 30 |
| Dosage (ions/cm$^{-2}$) | 1E+05 to 5E+05 | 1E+06 to 5E+06 | 1E+06 to 5E+06 |
| Ion Angle (degree) | 10 to 15 | 5 to 8 | 5 to 8 |
| Material for Mask 801 | C/Si/Ge | C/Si/Ge | C/Si/Ge |
| $W_1$ (nm) | 50 to 60 | 50 to 60 | 55 to 65 |
| $W_2$ (nm) | 35 to 45 | 40 to 50 | 45 to 55 |
| $W_1 - W_2$ (nm) | 15 to 20 | 8 to 15 | 8 to 15 |

Figure 12

METHOD FOR FORMING FEATURES OF SEMICONDUCTOR STRUCTURE HAVING REDUCED END-TO-END SPACING

PRIORITY CLAIM AND CROSS-REFERENCE

This application claims the benefit of U.S. Provisional Application Ser. No. 62/565,748, filed on Sep. 29, 2017, entitled "Method for Forming Features of Semiconductor Structure having Reduced End-to-End Spacing," which application is hereby incorporated herein by reference in its entirety.

BACKGROUND

With the increasing down-scaling of semiconductor devices, various processing techniques, such as photolithography are adapted to allow for the manufacture of devices with increasingly smaller dimensions. However, as semiconductor processes require smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12 illustrates various dimensions of a cut feature with respective parameters of an implantation process in accordance with some embodiments.

DETAILED DESCRIPTION

Figure 1A:
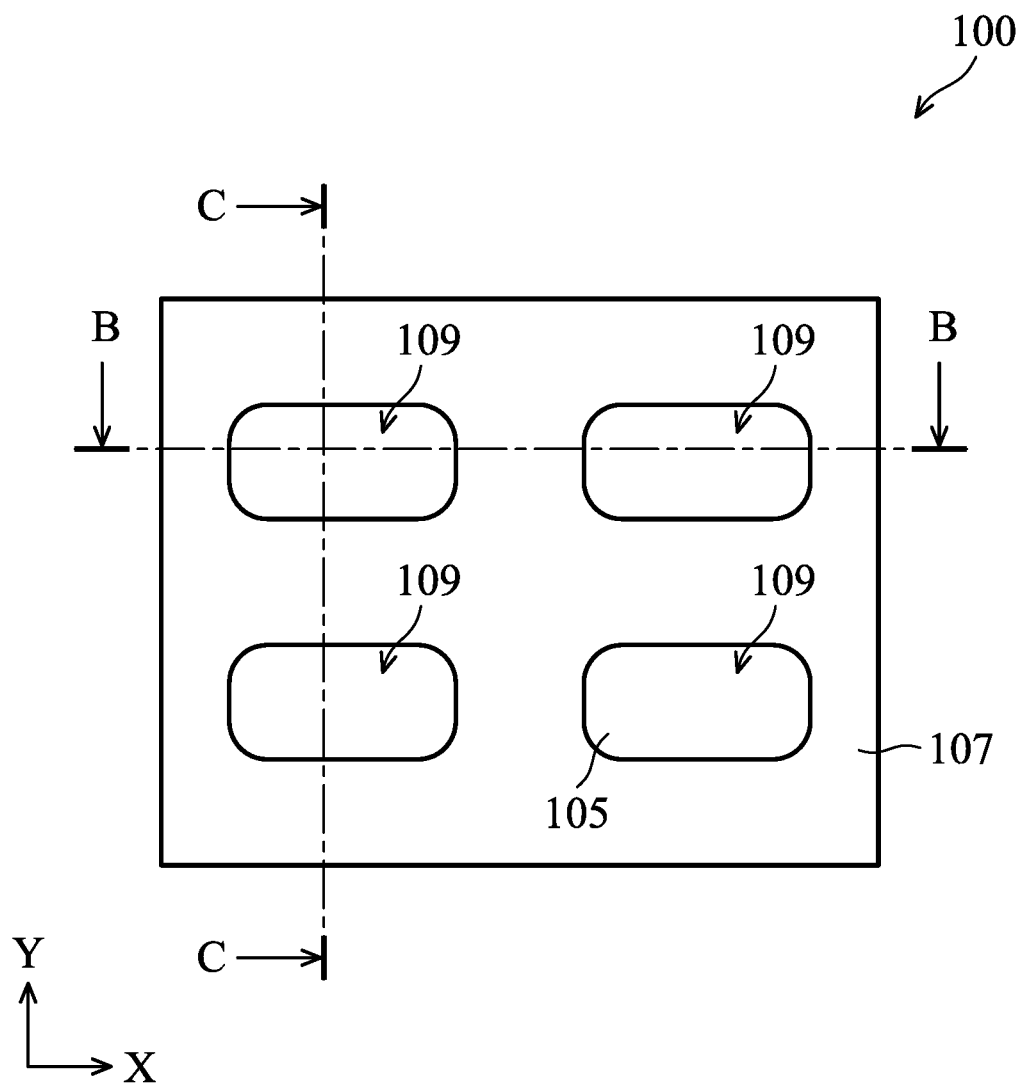
FIGS. 1A-4C illustrate top and cross-sectional views of various intermediate stages of fabrication of a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a method for patterning a target layer of a semiconductor structure to form features having a reduced end-to-end spacing. In some embodiments, the target layer may be any layer of the semiconductor structure where the features having the reduced end-to-end spacing are to be formed. In some embodiments, the target layer may be a mask layer, a sacrificial layer, an insulator layer, a dielectric layer, a conductive layer, a metal layer, a semiconductor layer, or a combination thereof.

FIGS. 1A-4C illustrate top and cross-sectional views of various intermediate stages of fabrication of a semiconductor structure in accordance with some embodiments. FIGS. 1A-4C illustrate top and cross-sectional views, where an "A" figure represents a top view, a "B" figure represents a cross-sectional view along a B-B line of the respective "A" figure, and a "C" figure represents a cross-sectional view along a C-C line of the respective "A" figure.

Figure 1B:
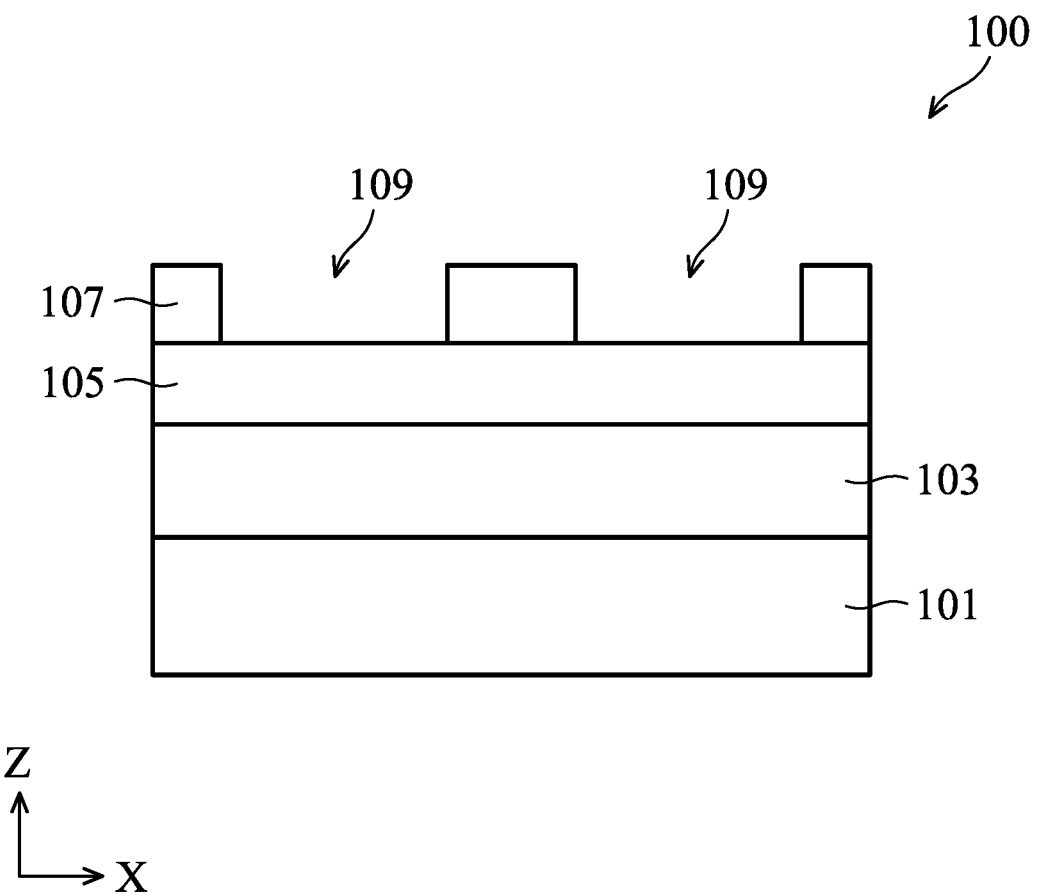
Figure 1C:
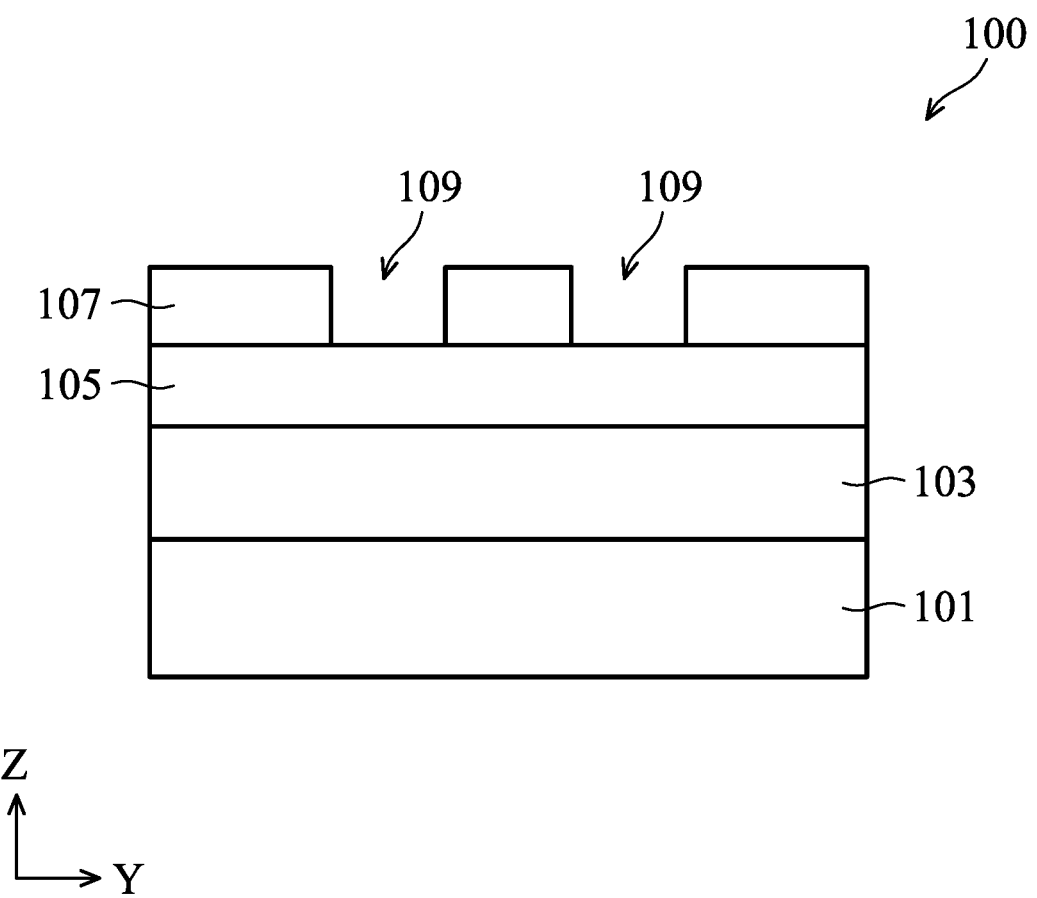

Referring to FIGS. 1A, 1B, and 1C, a portion of a wafer 100 is illustrated. In some embodiments, the wafer 100 may comprise a base layer 101, a target layer 103 over the base layer 101, a mask 105 over the target layer 103, and a mask 107 over the mask 105. As described below in greater detail, the masks 105 and 107 will be patterned to form desired patterns to be transferred to the target layer 103. In some embodiments, the mask 107 is patterned, a pattern of the mask 107 is transferred to the mask 105, and a pattern of the mask 105 is transferred to the target layer 103.

The base layer 101 may comprise a substrate. The substrate may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. In some embodiments, the base layer 101 may comprise a lower portion of the substrate and the target layer 103 may be an upper portion of the substrate. In such embodiments, upper portion of the substrate is patterned to form, for example, openings for isolation structures. In other embodiments, target layer 103 may be a mask formed over the substrate. In such embodiments, the mask is patterned and a pattern of the mask is transferred to the substrate to form, for example, openings for isolation structures.

In some embodiments, the base layer 101 may further comprise one or more active and/or passive devices that are formed on the substrate. The one or more active and/or passive devices may include various N-type metal-oxide semiconductor (NMOS) and/or P-type metal-oxide semiconductor (PMOS) devices, such as transistors, capacitors, resistors, diodes, photo-diodes, fuses, and the like. One of ordinary skill in the art will appreciate that the above examples are provided for the purpose of illustration only and are not meant to limit the present disclosure in any manner. Other circuitry may be also formed as appropriate for a given application.

In some embodiments, the base layer 101 may further comprise an interconnect structure formed over the one or more active and/or passive devices and the substrate. The interconnect structure electrically interconnects the one or more active and/or passive devices to form functional electrical circuits within the wafer 100. The interconnect structure may comprise one or more dielectric layers and one or more metallization layers within respective dielectric layers. The one or more dielectric layers may include an inter-layer dielectric (ILD)/inter-metal dielectric layers (IMDs) formed over the substrate and the one or more active and/or passive devices. The ILD/IMDs may be formed, for example, of a low-K dielectric material, such as phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, or the like, by any suitable method known in the art, such as a spin-on coating method, chemical vapor deposition (CVD), plasma enhanced CVD (PECVD), a combination thereof, or the like. In some embodiments, the one or more metallization layers may comprise various conductive features (such as conductive contacts in the ILD, and conductive lines and vias in the IMDs) formed in the ILD/IMDs using, for example, a damascene process, a dual damascene process, a combination thereof, or the like. In some embodiments, the conductive features may comprise copper, a copper alloy, silver, gold, tungsten, tantalum, aluminum, a combination thereof, or the like.

In some embodiments, the target layer 103 may be an ILD. In such embodiments, the target layer 103 may be patterned to form openings for conductive contacts, which provide electrical connection to the one or more active and/or passive devices. In other embodiments, the target layer 103 may be an IMD. In such embodiments, the target layer 103 may be patterned to form openings for conductive features of a respective metallization layer. In yet other embodiments, the target layer 103 may be a mask formed over an ILD or an IMD. In such embodiments, the mask is patterned and a pattern of the mask is transferred to the ILD or the IMD.

Referring further to FIGS. 1A, 1B, and 1C, the mask 105 may be a hard mask layer comprising one or more layers of silicon oxide, silicon nitride, silicon oxynitride, silicon carbide, silicon carbonitride, a combination thereof, or the like, and may be formed using any suitable process, such as thermal oxidation, thermal nitridation, atomic layer deposition (ALD), physical vapor deposition (PVD), chemical vapor deposition (CVD), a combination thereof, or the like. The mask 107 may comprise photoresist, and in some embodiments, may be used to pattern the mask 105 in the subsequent etching step. In some embodiments, the mask 107 may be formed by using a spin-on technique, or the like. In some embodiments where the mask 107 comprises photoresist, the mask 107 may be patterned using acceptable photolithography techniques to form openings 109 in the mask 107. In other embodiments, the mask 107 may comprise multiple layers, such as, for example, a tri-layer mask, and may be patterned using acceptable photolithography and etching techniques to form the openings 109.

Figure 2A:
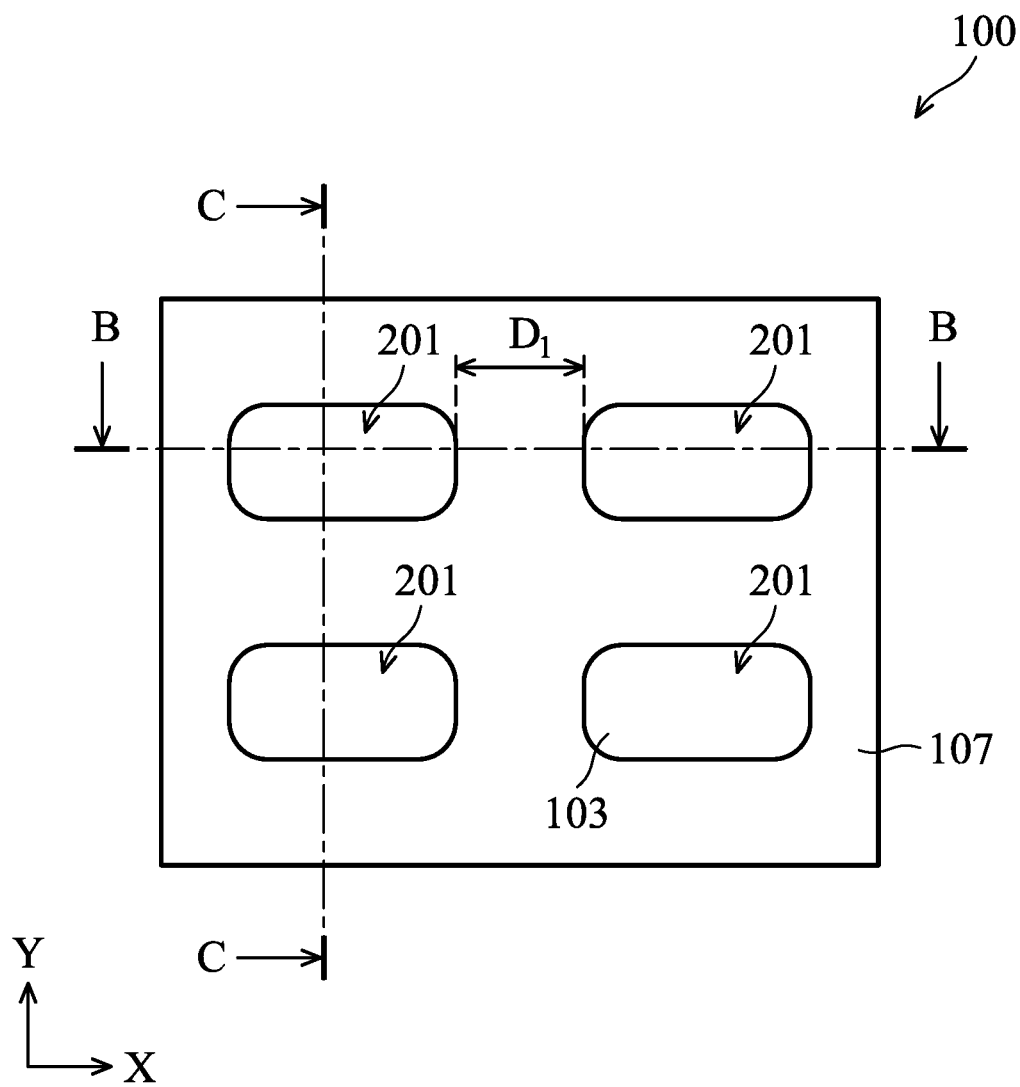
Figure 2B:
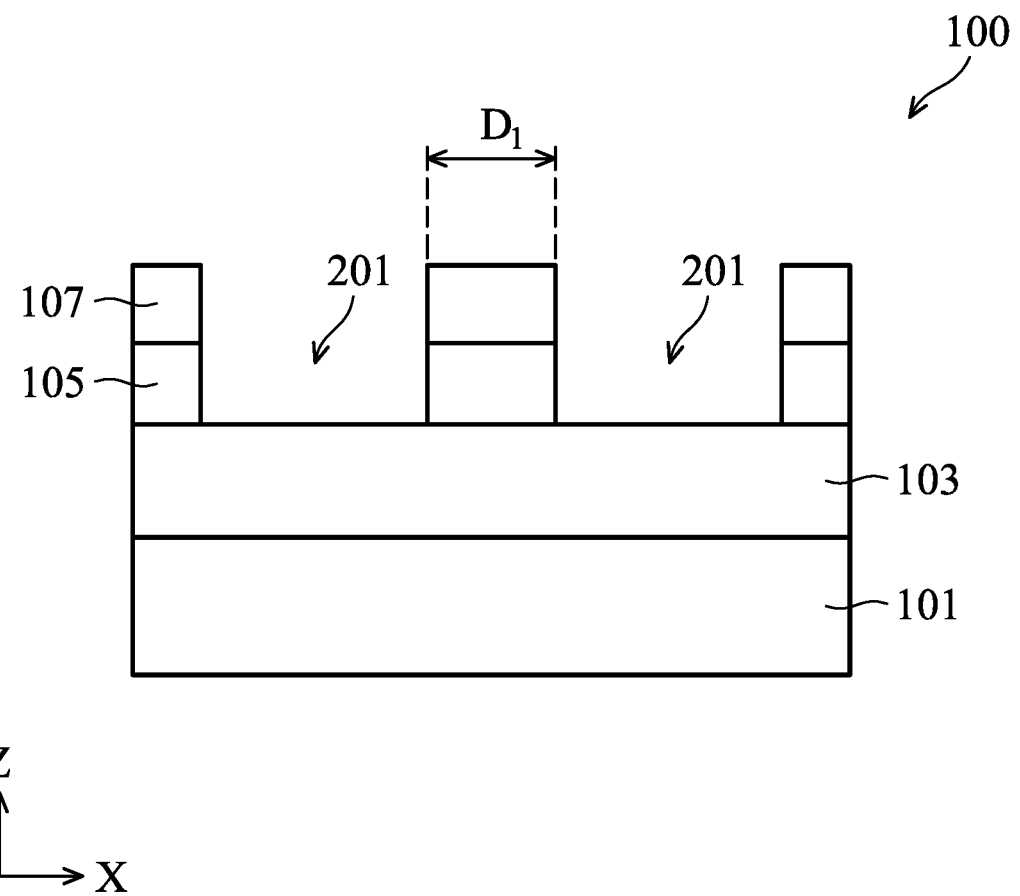
Figure 2C:
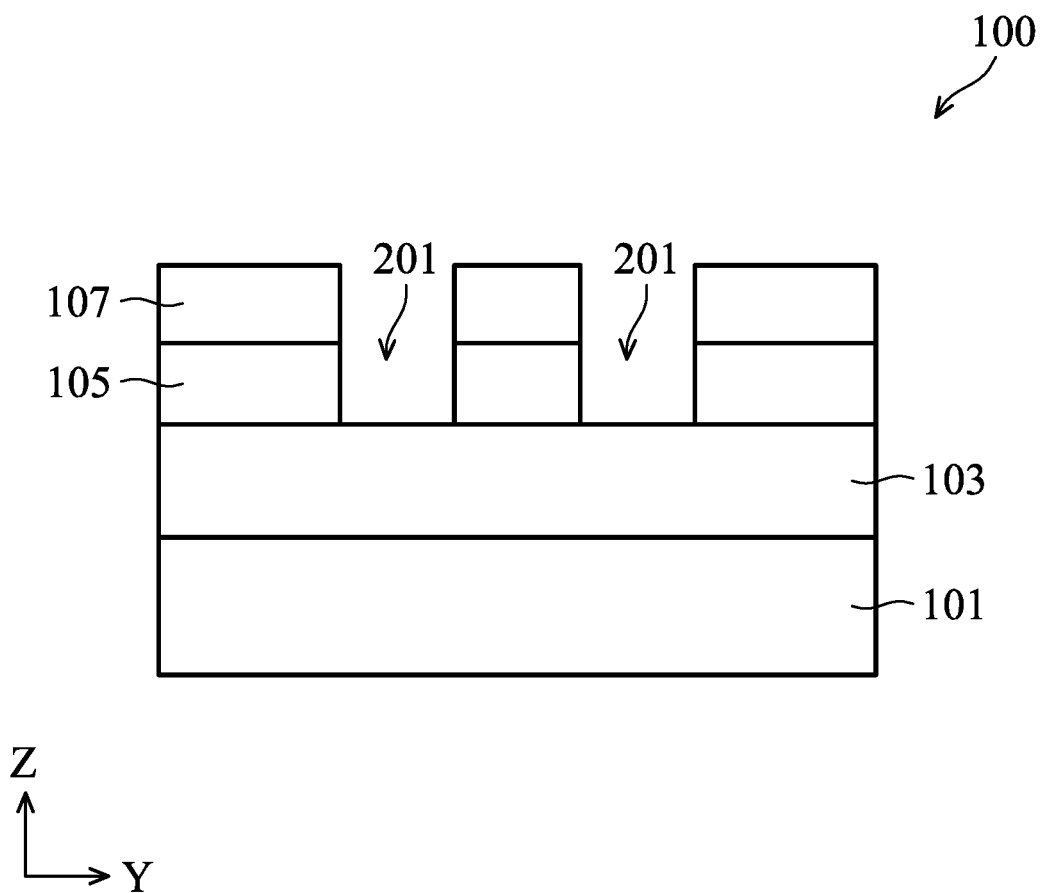

Referring to FIGS. 2A, 2B, and 2C, a first patterning process is performed on the mask 105 to form openings 201 in the mask 105. In some embodiments, the pattern of the mask 107 is transferred to the mask 105 using, for example, one or more suitable etching processes using the mask 107 as an etch mask. In some embodiments, one or more suitable etching processes may comprise an anisotropic dry etching process, or the like. In some embodiments where the mask 105 comprises silicon nitride, the mask 105 may be patterned by an anisotropic dry etching process using a process gas comprising a mixture of $CH_3F$ and $O_2$, a mixture of $CHF_6$ and $O_2$, or the like. In some embodiments, the first patterning process may comprise an anisotropic etching process having an etch rate in the Z direction different from an etch rate in a direction perpendicular to the Z direction, and having a same etch rate in any direction perpendicular to the Z direction. In some embodiments, the first patterning process may comprise an anisotropic etching process having an isotropic etch rate in the XY plane perpendicular to the Z direction. In other words, the first patterning process may comprise an anisotropic etching process, such that the anisotropic etching process is an isotropic etching process on the XY plane. The openings 201 have an end-to-end spacing $D_1$ along X direction. In some embodiments, the end-to-end spacing $D_1$ may be between about 10 nm and about 100 nm. In some embodiments, the end-to-end spacing $D_1$ may be greater than the desired end-to-end spacing. As described below in greater detail, the end-to-end spacing is reduced to the desired value according to design specifications of the resulting semiconductor structure.

Figure 3A:
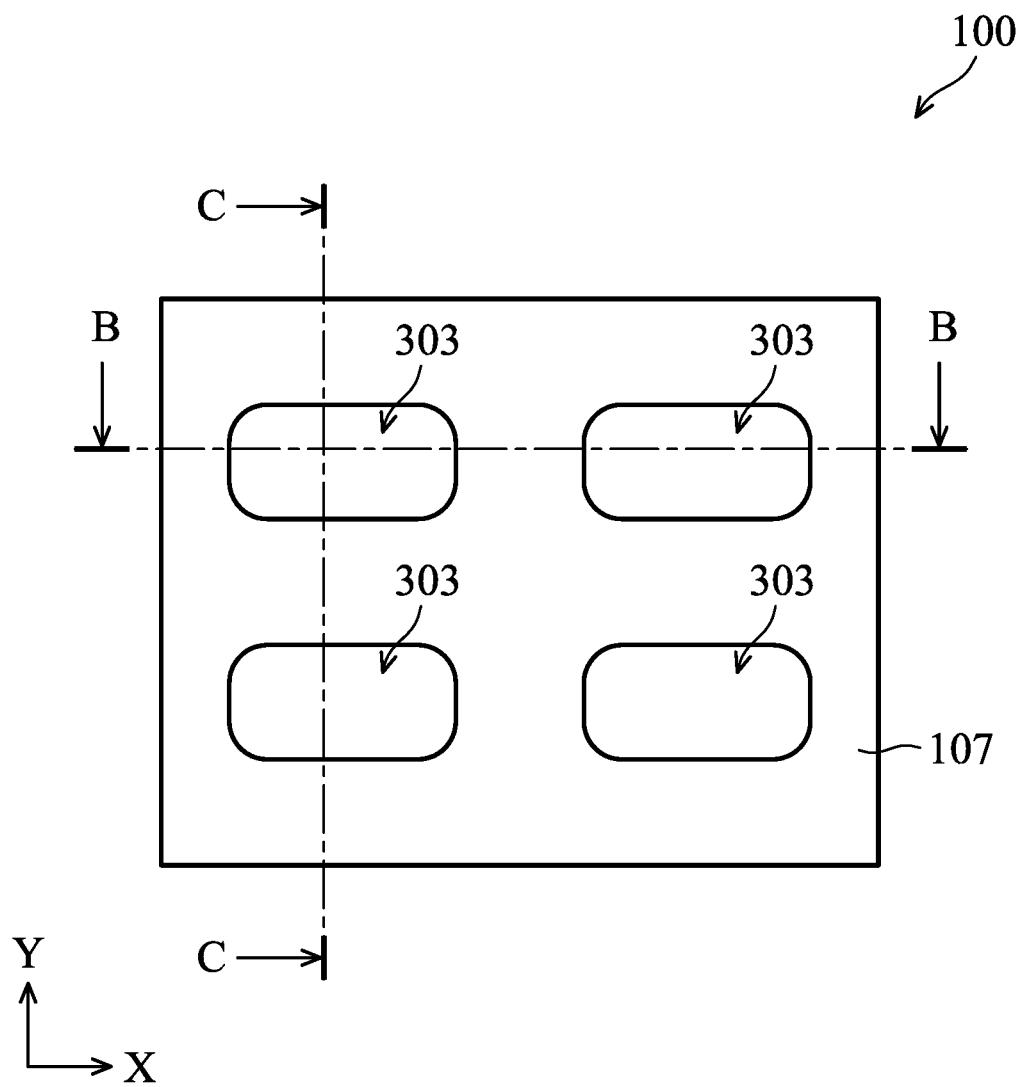
Figure 3B:
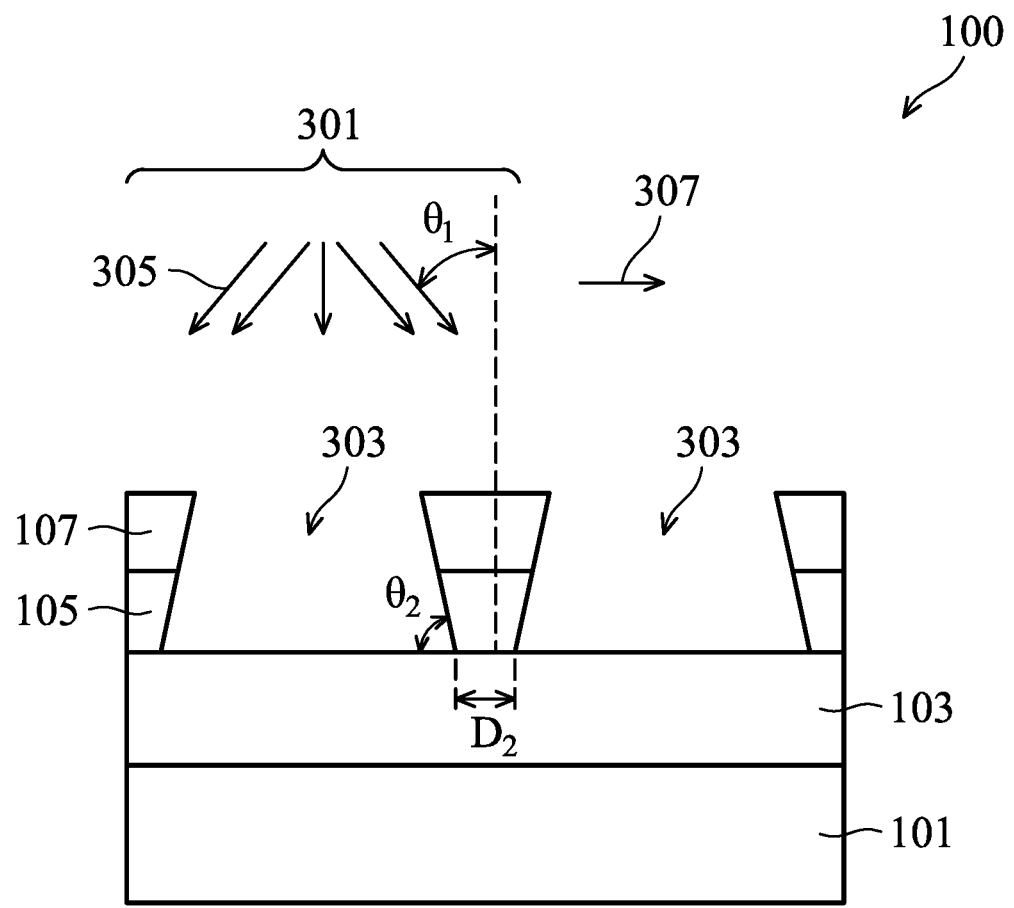
Figure 3C:
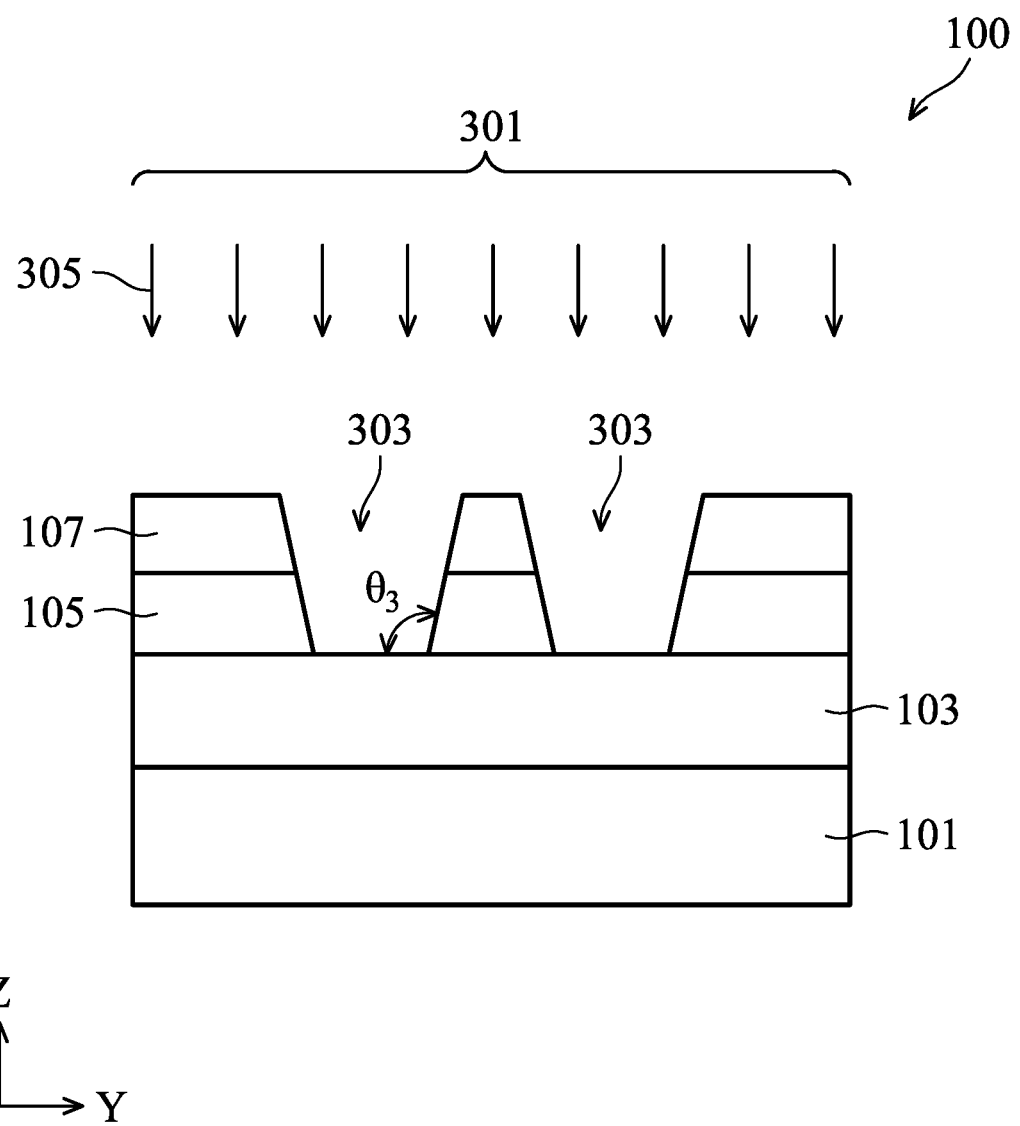

Referring to FIGS. 3A, 3B, and 3C, a second patterning process is performed on the mask 105 to enlarge the openings 201 (see FIGS. 2A, 2B, and 2C) and form openings 303 in the mask 105. The openings 303 have an end-to-end spacing $D_2$ along X direction. In some embodiments, the end-to-end spacing $D_2$ of the openings 303 is less than the end-to-end spacing $D_1$ of the openings 201 (see FIGS. 2A, 2B, and 2C). In some embodiments, the end-to-end spacing $D_2$ may be between about 3 nm and about 10 nm. In some embodiments, a ratio $D_2/D_1$ may be between about 0.3 and about 1. In some embodiments, the second patterning process may comprise an anisotropic dry etching process, or the like. In some embodiments where the mask 105 comprises silicon nitride, the mask 105 may be patterned by an anisotropic dry etching process using a process gas comprising a mixture of $CH_3F$ and $O_2$, a mixture of $CHF_6$ and $O_2$, or the like. In some embodiment, the anisotropic dry etching process may be performed using a plasma ribbon beam 301 that scans a top surface of the wafer 100 in a direction 307 parallel to the top surface of the wafer 100. In some embodiments, the plasma ribbon beam 301 may comprise neutral radicals and charged ions, where the direction of the charged ions are represented by arrows 305. In some embodiments, a width of the plasma ribbon beam 301 in the X direction may be less than a width of the plasma ribbon beam 301 in the Y direction. In some embodiments, the width of the plasma ribbon beam 301 in the Y direction may be equal to or greater than a diameter of the wafer 100. In such embodiments, the plasma ribbon beam 301 scans the top surface of the wafer 100 along a single axis or a single direction, such as the X direction. In other embodiments, the width of the plasma ribbon beam 301 in the Y direction may be less than the diameter of the wafer 100. In such embodiments, the plasma ribbon beam 301 may scan the top surface of the wafer 100 along two different axes or two different directions, such as the X direction and the Y direction. In some embodiments, the width of the plasma ribbon beam 301 in the X direction may be between about 30 nm and about 100 nm. In some embodiments, the width of the plasma ribbon beam 301 in the Y direction may be between about 3 nm and about 30 nm.

In some embodiments, the direction 305 of ions and a line perpendicular to a top surface of the wafer 100 (or a top surface of the target layer 103) may form a non-zero angle. In the illustrated embodiment, the direction 305 of ions and line perpendicular to the top surface of the wafer 100 (or the top surface of the target layer 103) form an angle $\theta_1$ in the XZ cross-section (see FIG. 3B), while the direction 305 of ions is substantially perpendicular to the top surface of the wafer 100 (or the top surface of the target layer 103) in the YZ cross-section (see FIG. 3C). In such embodiments, the etching process performed by the plasma ribbon beam 301 is anisotropic in the XY plane, such that an etch rate in the X direction is greater than an etch rate in the Y direction. In some embodiments, a ratio of the etch rate in the X direction to the etch rate in the Y direction is between about 10 and about 30. In the illustrated embodiment, the etching process performed by the plasma ribbon beam 301 allows for reducing the end-to-end distance in the X direction. In other embodiments, the direction of the ions in the plasma ribbon beam 301 may be altered such that the end-to-end distance may be reduced in a desired direction. In some embodiment, the angle $\theta_1$ may be between about 15 degrees and about 40 degrees.

Referring further to FIGS. 3A, 3B, and 3C, due to anisotropic nature of the etching process performed by the plasma ribbon beam 301 in the XY plane, the openings 303 may have different profiles in different cross-sections. In some embodiments, sidewalls of the openings 303 may form an angle $\theta_2$ with bottoms of the openings 303 in the XZ cross-section (see FIG. 3B). In some embodiments, the angle $\theta_2$ may be less than 90 degrees, such as between about 70 degrees and about 88 degrees. In some embodiments, the sidewalls of the openings 303 may form an angle $\theta_3$ with the bottoms of the openings 303 in the YZ cross-section (see FIG. 3C). In some embodiments, the angle $\theta_3$ may be greater than 90 degrees, such as between about 92 degrees and about 102 degrees.

Figure 4A:
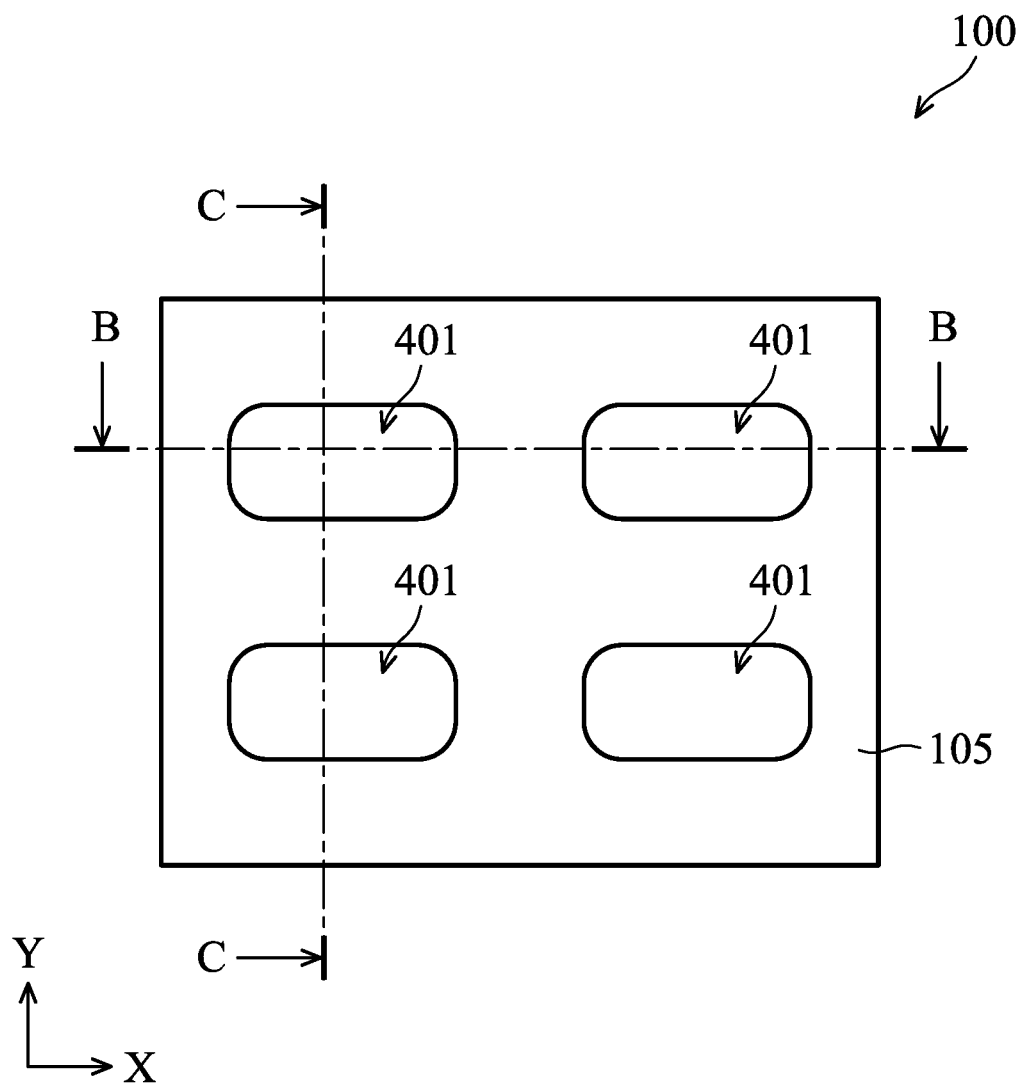
Figure 4B:
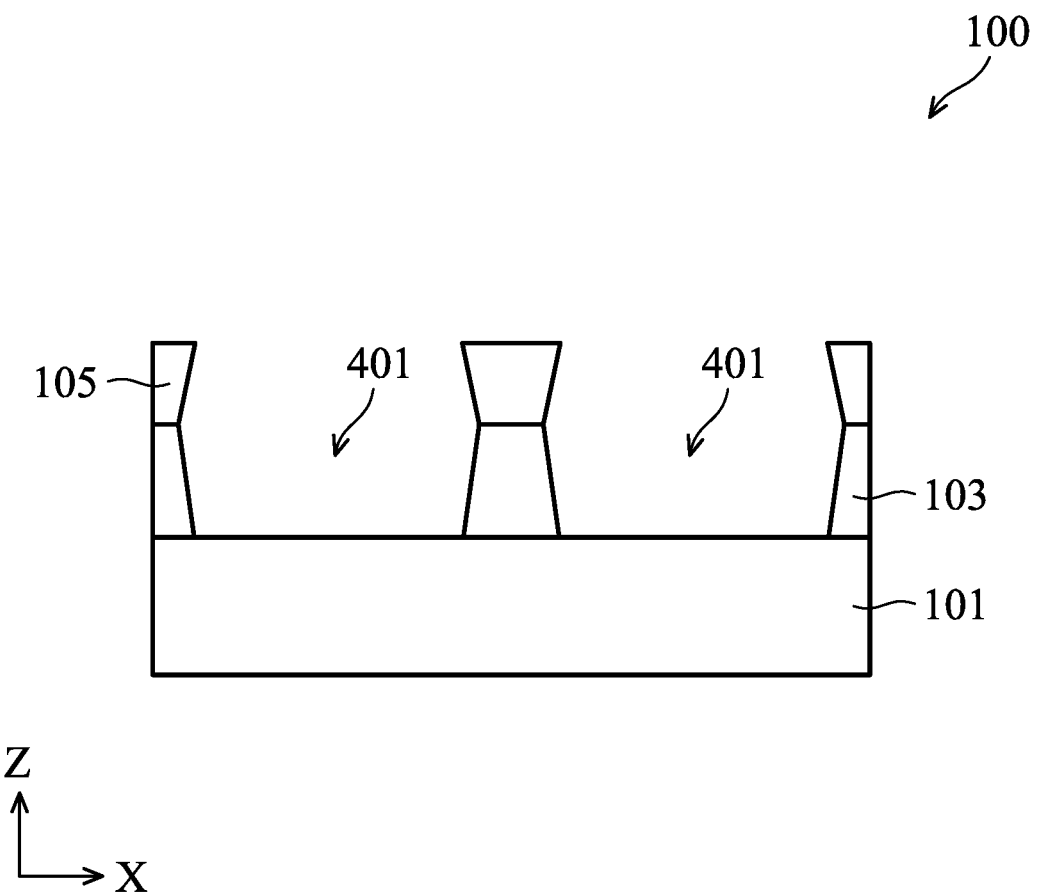
Figure 4C:
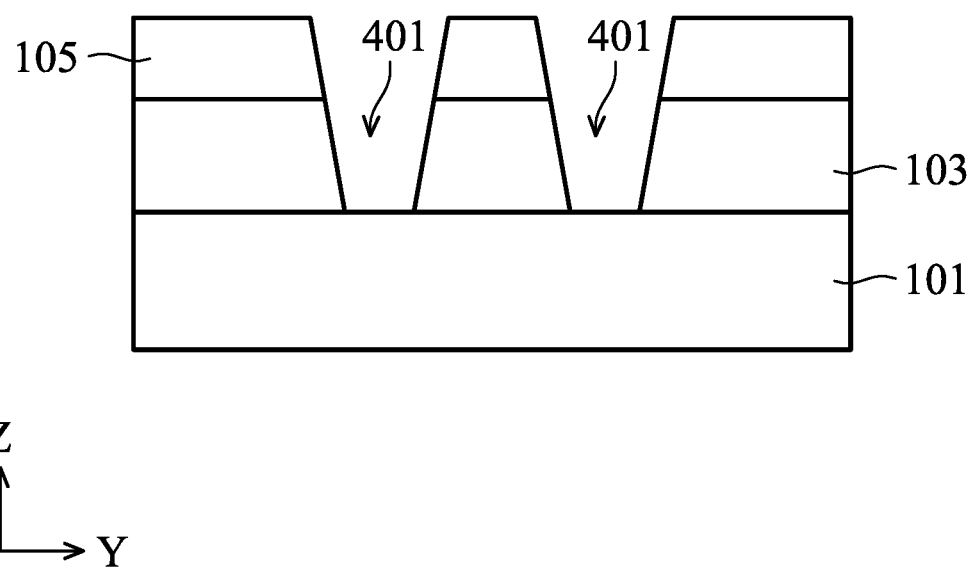

Referring to FIGS. 4A, 4B, and 4C, in some embodiments, after forming the openings 303, the mask 107 (see FIGS. 3A, 3B, and 3C) is removed. In some embodiments where the mask 107 comprises photoresist, the mask 107 may be removed using an ashing process followed by a wet clean process. Subsequently, the pattern of the mask 105 is transferred to the target layer 103 to form openings 401 in the target layer 103. In some embodiments, the openings 401 may be formed using a suitable etching process, such as an anisotropic dry etching process, using the mask 105 as an etch mask. In some embodiments, an end-to-end spacing of the openings 401 in the X direction may be substantially same as the end-to-end spacing $D_2$ of the openings 303 in the X direction (see FIGS. 3A, 3B, and 3C). In some embodiments, the openings 401 may be filled with a suitable material. In some embodiments where the target layer 103 is an upper portion of the substrate, the openings 401 may be filled with a suitable dielectric material to form isolation regions in the openings 401. In some embodiments where the target layer 103 is an ILD or an IMD, the openings 401 may be filled with a suitable conductive material to form conductive features in the openings 401.

Figure 5:
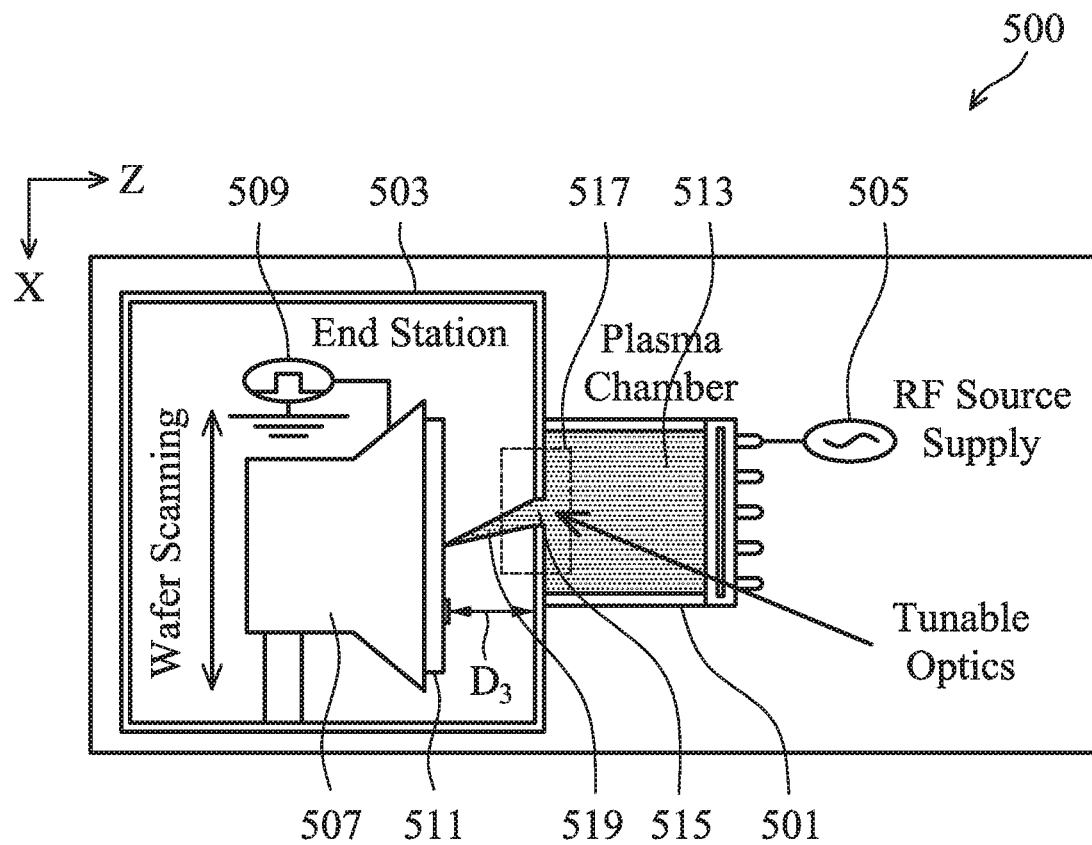
FIG. 5 illustrates a schematic diagram of an etching apparatus in accordance with some embodiments.

FIG. 5 illustrates a schematic diagram of an etching apparatus 500 in accordance with some embodiments. In some embodiments, the etching apparatus 500 may be used to perform the second patterning process described above with reference to FIGS. 3A, 3B, and 3C. In some embodiments, the etching apparatus 500 comprises a plasma chamber 501 attached to a process chamber 503. A radio frequency (RF) system 505 is coupled to the plasma chamber 501 to generate plasma 513 in the plasma chamber 501. The process chamber 503 comprises a stage 507 to support a wafer 511 during the etching process. In some embodiments, the wafer 511 may be similar to the wafer 100 described above with reference to FIGS. 1A, 1B, and 1C, and the description is not repeated herein. In some embodiments, the stage 507 may comprise a chuck that is configured to hold the wafer 511 during the etching process. In some embodiments, the chuck may be a vacuum chuck, an electrostatic chuck, or the like. In some embodiments, the stage 507 is coupled to a bias voltage source 509. In some embodiments, the bias voltage source 509 may be configured to provide pulsed voltage. In some embodiments, an electric field generated by the bias voltage source 509 between the wafer 511 and the plasma chamber 501 accelerates ions of the plasma 513 toward the wafer 511. In some embodiments, the plasma chamber 501 may comprise an aperture 515 and an ion extraction optics 517 adjacent the aperture 515. In some embodiments, the ion extraction optics 517 may comprise suitable electrostatic and magnetostatic fields and may be configured to alter a direction or an angle of the ions extracted through the aperture 515. In some embodiments, the ion extraction optics 517 may comprise one or more electrodes and one or more magnets configured to generate suitable electrostatic and magnetostatic fields. In some embodiments, the electrostatic and magnetostatic fields of the ion extraction optics 517 may act as lenses that steer and focus the ions toward a desired direction and form a plasma ribbon beam 519 to be used in an etching process of the wafer 511. In some embodiments, the stage 507 may be configured to move in a direction parallel to an etched side of the wafer 511, such that the plasma ribbon beam 519 scans a portion or an entirety of the wafer 511 during the etching process. In some embodiments, the aperture 515 is separated from the wafer 511 by a distance $D_3$. In some embodiments, the distance $D_3$ may be between about 5 mm and about 18 mm.

Figure 6:
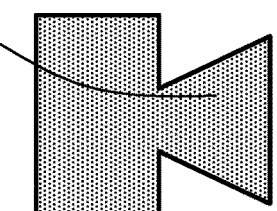
FIG. 6 illustrates various plasma ribbon beam profiles with respective parameters of an etching apparatus in accordance with some embodiments.
Figure 6:
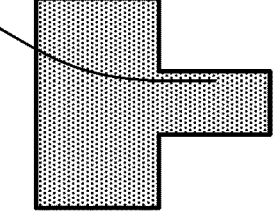
Figure 6:
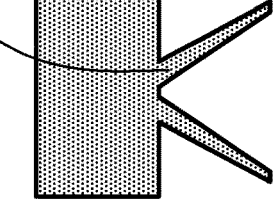
Figure 6:
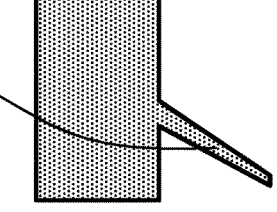
Figure 6:
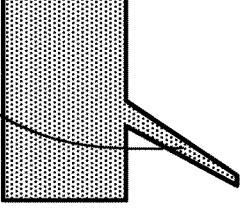

FIG. 6 illustrates various plasma ribbon beam profiles 601a to 601e with respective parameters of the etching apparatus 500 (see FIG. 5) in accordance with some embodiments. Referring to FIGS. 5 and 6, in some embodiments, a profile of the plasma ribbon beam 519 may be configured by varying a plasma density of the plasma ribbon beam 519, an electric-ile field between the wafer 511 and the plasma chamber 501, a direction of the ions in the plasma ribbon beam 519, and the electrostatic and magnetostatic fields of the ion extraction optics 517. In some embodiments, the direction of the ions in the plasma ribbon beam 519 may be tuned by varying the electrostatic and magnetostatic fields of the ion extraction optics 517 and by varying the distance $D_3$ between the aperture 515 and the wafer 511. In some embodiments, the plasma density in the plasma ribbon beam 519 may be tuned by varying a process gas flow, an RF power of an RF field generated by the RF system 505, and an RF frequency of the RF field generated by the RF system 505. In some embodiments, the electric field between the wafer 511 and the plasma chamber 501 may be tuned by varying a duty ratio (or a duty cycle) of the bias voltage source 509 and the distance $D_3$ between the aperture 515 and the wafer 511. In some embodiments, the bias voltage source 509 generates a pulsed bias voltage and the duty ratio (duty cycle) of the bias voltage source 509 is defined as a ratio of a pulse width (pulse active time) of the pulsed bias voltage to a period of the pulsed bias voltage.

Referring further to FIGS. 5 and 6, in Embodiment 1, the plasma ribbon beam 519 may have a plasma ribbon beam profile 601a such that a width of the plasma ribbon beam 519 may increase as the plasma ribbon beam 519 extends toward the wafer 511, with an axis of the plasma ribbon beam 519 forming a substantially zero angle with a direction perpendicular to the wafer 511. In Embodiment 2, the plasma ribbon beam 519 may have a plasma ribbon beam profile 601b such that a width of the plasma ribbon beam 519 may be substantially same as the plasma ribbon beam 519 extends toward the wafer 511, with an axis of the plasma ribbon beam 519 forming a substantially zero angle with a direction perpendicular to the wafer 511. In Embodiment 3, the plasma ribbon beam 519 may have a plasma ribbon beam profile 601c such that a width of the plasma ribbon beam 519 may decrease as the plasma ribbon beam 519 extends toward the wafer 511, with an axis of the plasma ribbon beam 519 forming a substantially zero angle with a direction perpendicular to the wafer 511. In Embodiment 4, the plasma ribbon beam 519 may have a plasma ribbon beam profile 601d such that the plasma ribbon beam 519 may split into two sub-beams as the plasma ribbon beam 519 extends toward the wafer 511, with an axis of each of the sub-beams forming a non-zero angle with a direction perpendicular to the wafer 511. In Embodiment 5, the plasma ribbon beam 519 may have a plasma ribbon beam profile 601e such that an axis of the plasma ribbon beam 519 forms a non-zero angle with a direction perpendicular to the wafer 511.

Figure 7A:
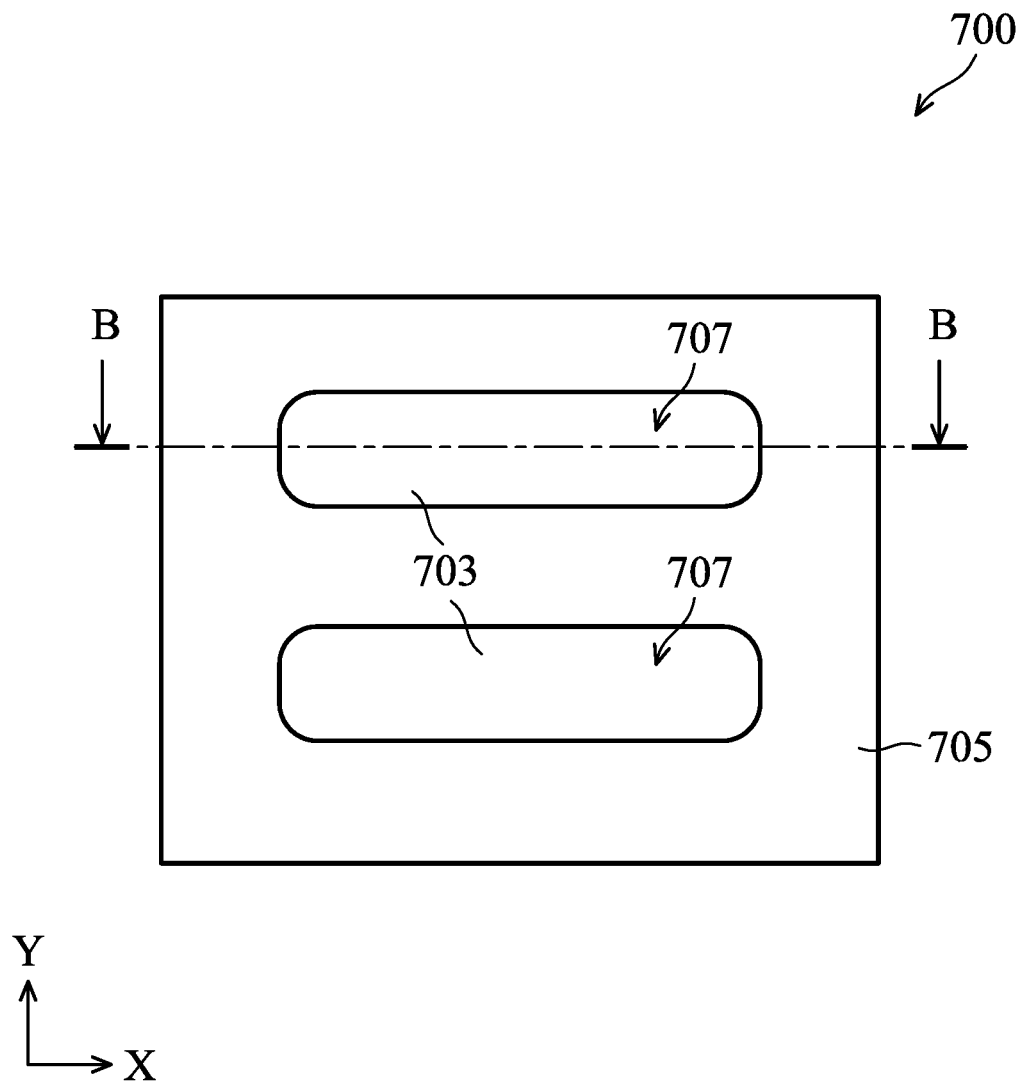
FIGS. 7A-11B illustrate top and cross-sectional views of various intermediate stages of fabrication of a semiconductor structure in accordance with some embodiments.
Figure 7B:
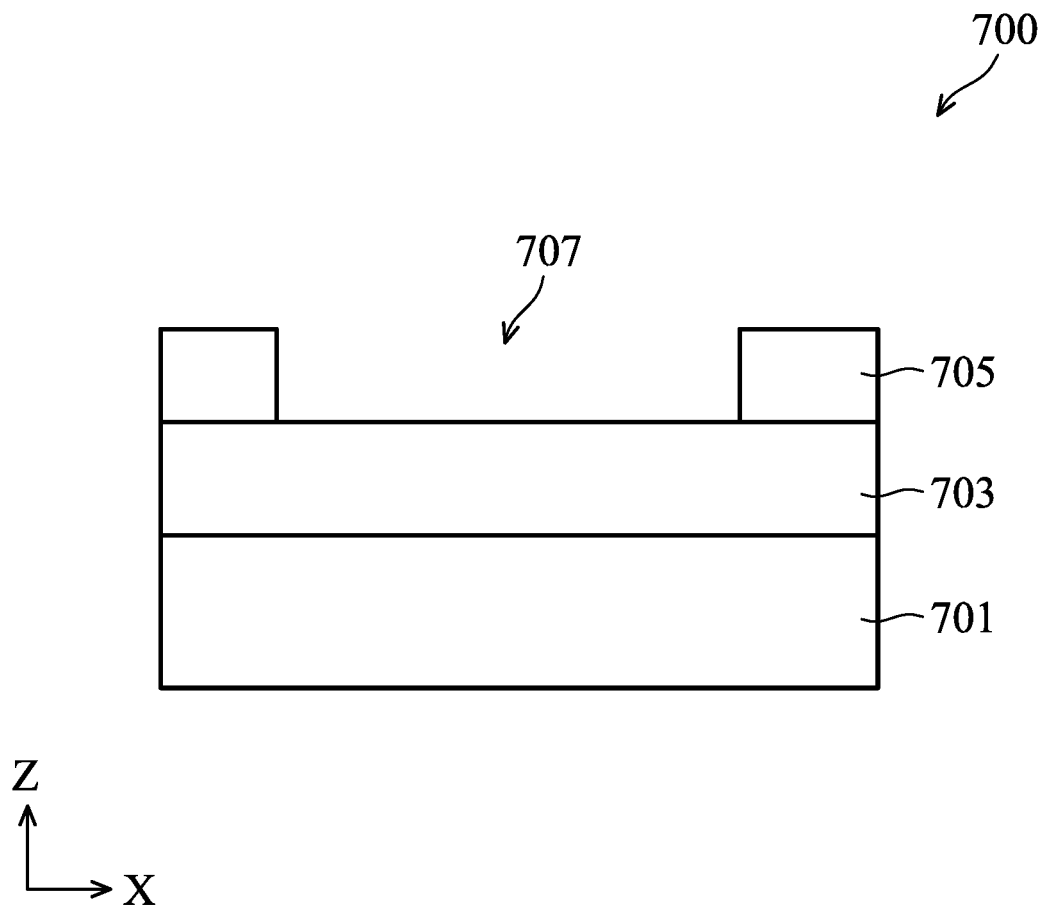

FIGS. 7A-11B illustrate top and cross-sectional views of various intermediate stages of fabrication of a semiconductor structure in accordance with some embodiments. FIGS. 7A-11B illustrate top and cross-sectional views, where an "A" figure represents a top view and a "B" figure represents a cross-sectional view along a B-B line of the respective "A" figure. Referring to FIGS. 7A and 7B, a portion of a wafer 700 is illustrated. In some embodiments, the wafer 700 may comprise a base layer 701, a target layer 703 over the base layer 701, and a mask 705 over the target layer 703. In some embodiments, the base layer 701 may be formed using similar materials and method as the base layer 101 described above with reference to FIGS. 1A, 1B and 1C, and the description is not repeated herein. In some embodiments, the target layer 703 may be formed using similar materials and method as the target layer 103 described above with reference to FIGS. 1A, 1B and 1C, and the description is not repeated herein. In some embodiments, the mask 705 may be formed using similar materials and method as the mask 105 described above with reference to FIGS. 1A, 1B and 1C, and the description is not repeated herein. After forming the mask 705, the mask 705 is patterned to form opening 707 in the mask 705. In some embodiments, the mask 705 may be patterned using similar methods as the mask 105 described above with reference to FIGS. 2A, 2B, and 2C, and the description is not repeated herein.

Figure 8A:
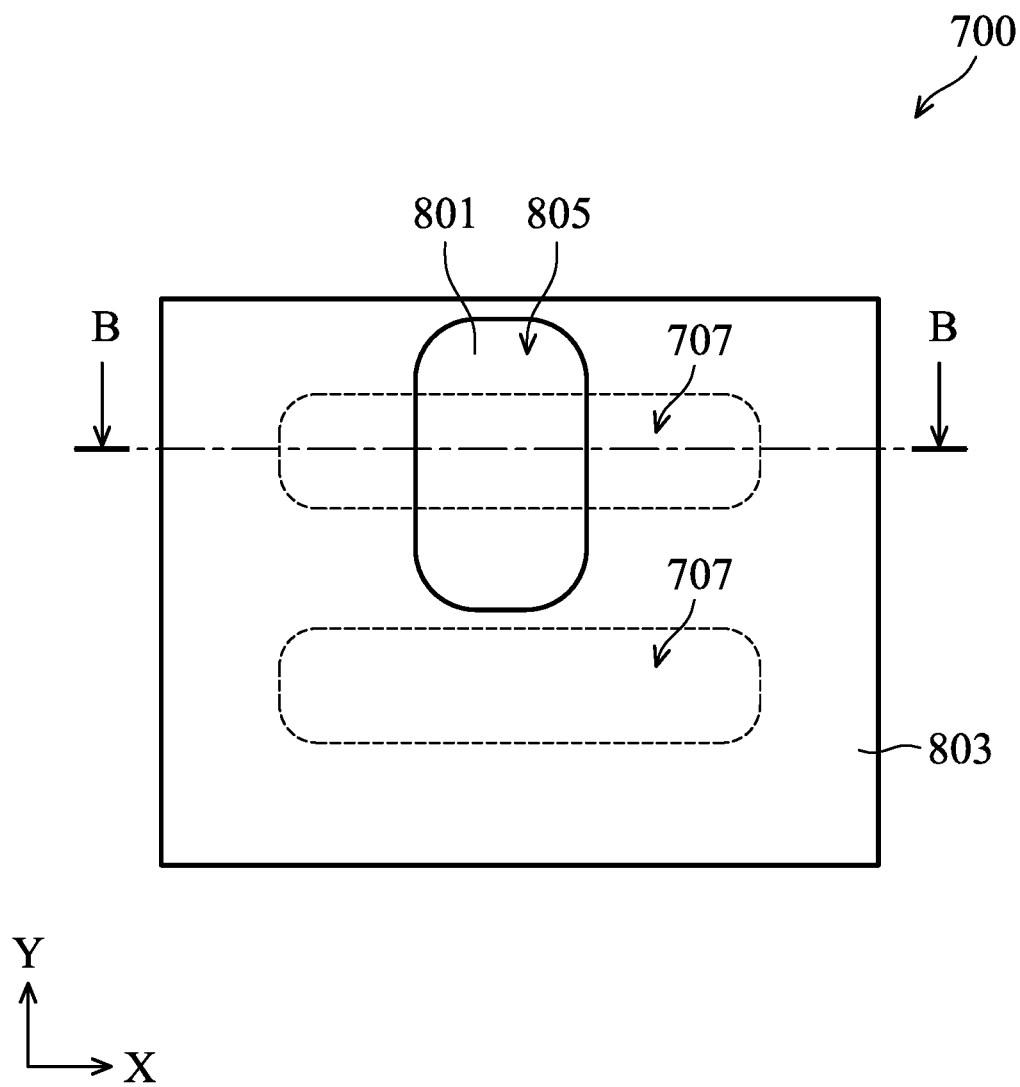
Figure 8B:
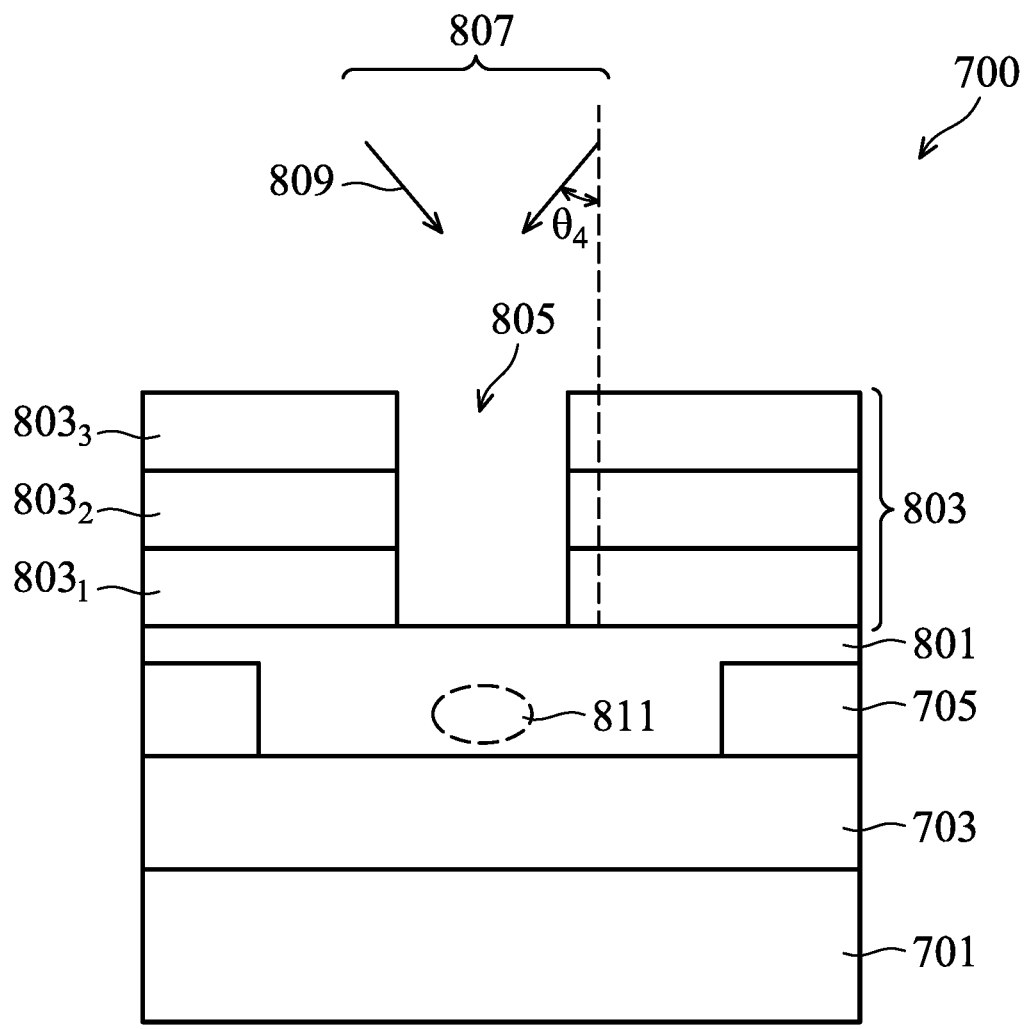

Referring to FIGS. 8A and 8B, a mask 801 is formed over the mask 705 and in the openings 707. Subsequently, a mask 803 is formed over the mask 801. In some embodiments, the mask 801 may comprise silicon, or the like, and may be formed using CVD, ALD, or the like. In some embodiments, the mask 801 may have a thickness between about 80 Å and about 300 Å. In some embodiments, the mask 803 may comprise one or more layers. In the illustrated embodiment, the mask 803 is a tri-layer mask and comprises a bottom layer $803_1$, a middle layer $803_2$ over the bottom layer $803_1$, and a top layer $803_3$ over the middle layer $803_2$. In some embodiments, the bottom layer $803_1$ may comprise an organic material, such as a spin-on carbon (SOC) material, or the like, and may be formed using spin-on coating, CVD, ALD, or the like. The middle layer $803_2$ may comprise an inorganic material, which may be a nitride (such as SiN, TiN, TaN, or the like), an oxynitride (such as SiON), an oxide (such as silicon oxide), or the like, and may be formed using CVD, ALD, or the like. The top layer $803_3$ may comprise an organic material, such as a photoresist material, and may be formed using a spin-on coating, or the like. In some embodiments, the middle layer $803_2$ has a higher etch rate than the top layer $803_3$, and the top layer $803_3$ is used as an etch mask for patterning of the middle layer $803_2$. In some embodiments, the bottom layer $803_1$ has a higher etch rate than the middle layer $803_2$, and the middle layer $803_2$ is used as an etch mask for patterning of the bottom layer $803_1$. After forming the mask 803, the mask 803 is patterned to form an opening 805 therein. In some embodiments, the mask 803 may be patterned using suitable photolithography and etching techniques. In some embodiments, the opening 805 overlaps with at least one of the openings 707 in a plan view as illustrated in FIG. 8A. In some embodiments, a width of the opening 805 is different from a width of the openings 707. In the illustrated embodiment, a width of the opening 805 along the X direction is less than a width of the openings 707 along the X direction as illustrated in FIG. 8A. In the illustrated embodiment, a width of the opening 805 along the Y direction is greater than a width of the openings 707 along the Y direction as illustrated in FIG. 8A.

Referring further to FIGS. 8A and 8B, after forming the opening 805 in the mask 803, a first implantation process (IMP1) 807 is performed on the mask 801 through the opening 805 to form a doped region 811. In some embodiments, the IMP1 807 is performed using ions that form a non-zero angle with a direction perpendicular to a top surface of the wafer 700 (or a top surface of the target layer 703). In some embodiments, the IMP1 807 may be performed using ions of boron, phosphorus, arsenic, gallium, indium, or the like. In some embodiments, the IMP1 807 may be performed using ions having an energy between about 15 KJ and about 30 KJ. In some embodiments, the direction of ions represented by arrows 809 may form an angle $\theta_4$ with the direction perpendicular to the top surface of the wafer 700 (or the top surface of the target layer 703). In some embodiments, due to the non-zero value for the angle $\theta_4$, a width of the doped region 811 may be less than a width of the opening 805. In some embodiments, the angle $\theta_4$ may be between about 5 degrees and about 12 degrees. In some embodiments, a width of the doped region 811 may be between about 100 Å and about 250 Å.

Figure 9A:
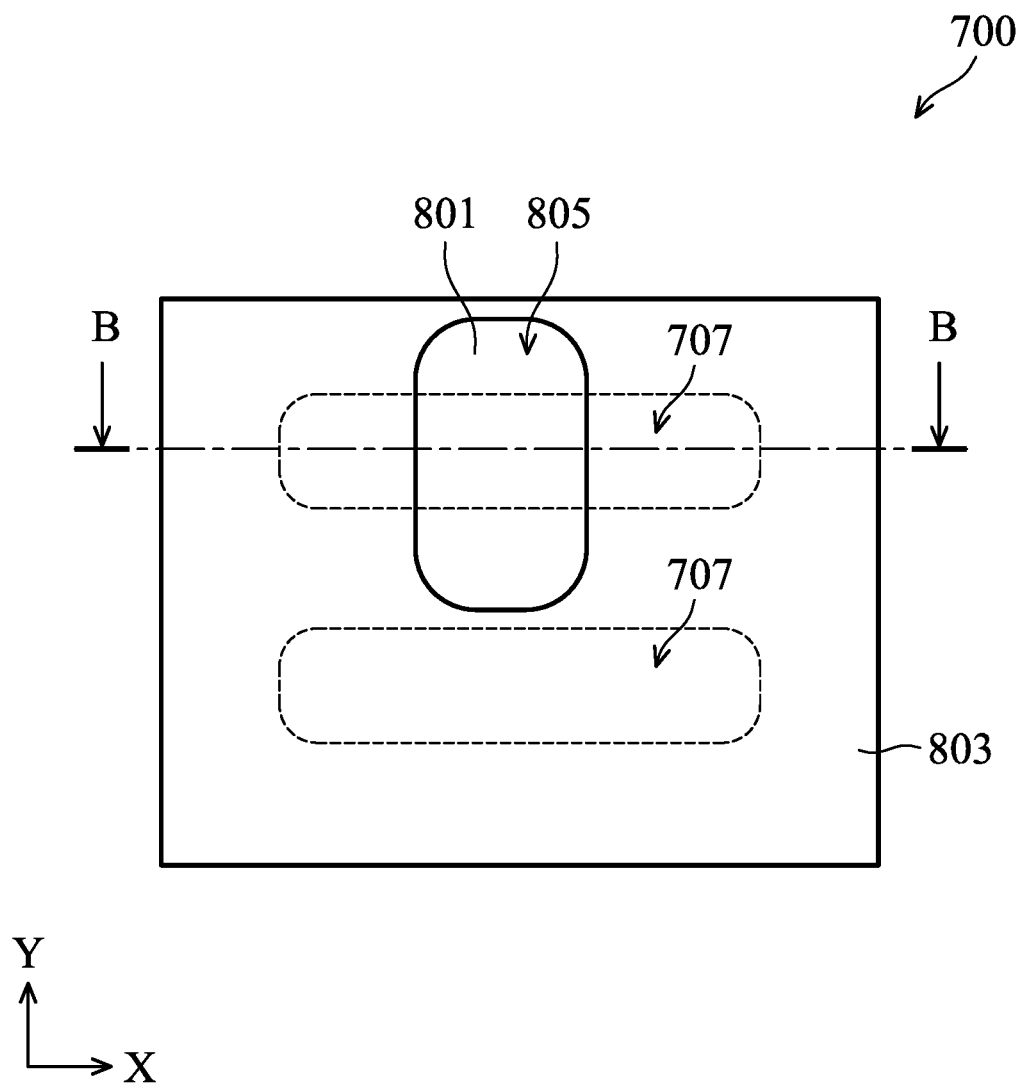
Figure 9B:
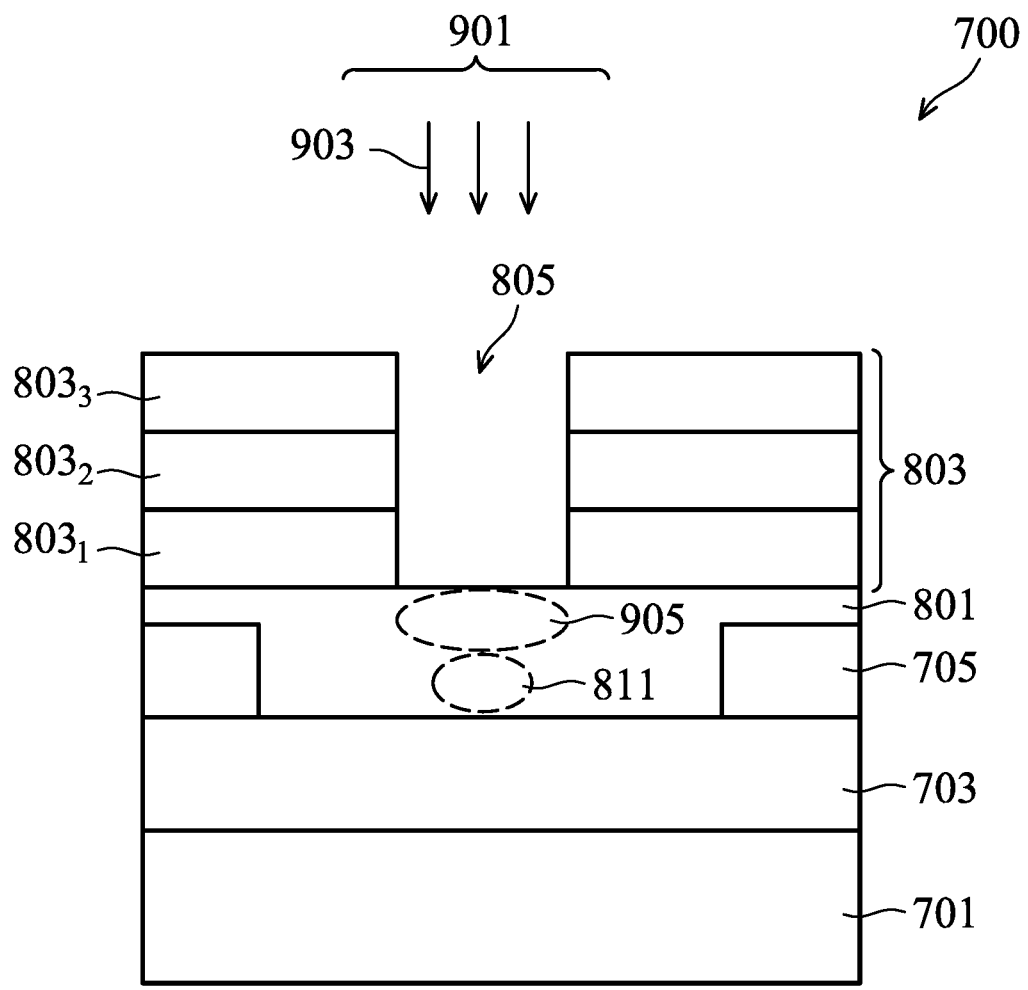

Referring to FIGS. 9A and 9B, after performing the IMP1 807, a second implantation process (IMP2) 901 is performed on the mask 801 through the opening 805 to form a doped region 905 in the mask 801. In some embodiments, a direction of ions illustrated using arrows 903 may be substantially perpendicular to the top surface of the wafer 700 (or the top surface of the target layer 703). Accordingly, a width of the doped region 905 may be substantially equal to the width of the opening 805, and may be greater than the width of the doped region 811. In some embodiments, a width of the doped region 905 may be between about 12 nm and about 50 nm. In some embodiments, the IMP2 901 may be performed using ions of boron, phosphorus, arsenic, gallium, indium, or the like. In some embodiments, the IMP1 807 and the IMP2 901 may be performed using ions of a same element. In other embodiments, the IMP1 807 and the IMP2 901 may be performed using ions of different elements. In some embodiments, the IMP2 901 may be performed using ions having an energy between about 17 KJ and about 25 KJ. In some embodiments, the IMP1 807 may be performed at a higher ion energy than the IMP2 901. In such embodiments, the doped region 811 is disposed below the doped region 905 in the mask 801. In some embodiments, the doped regions 811 and 905 of the mask 801 may have a different etch rate than the undoped regions of the mask 801. In some embodiments, the doped regions 811 and 905 of the mask 801 may have a lower etch rate than the undoped regions of the mask 801 in a subsequent etching process. In such embodiments, the undoped regions of the mask 801 may be selectively removed in the subsequent etching process as described below in greater detail.

Figure 10A:
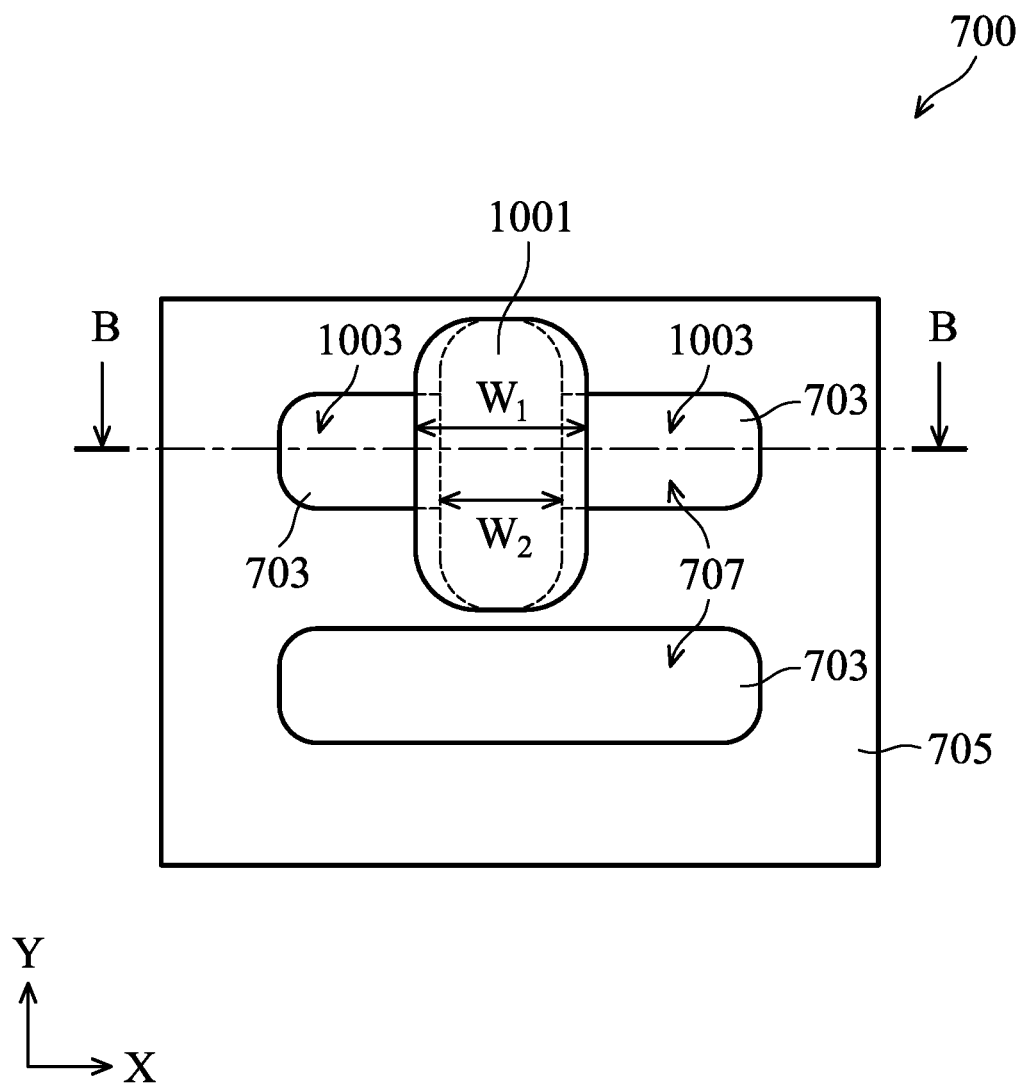
Figure 10B:
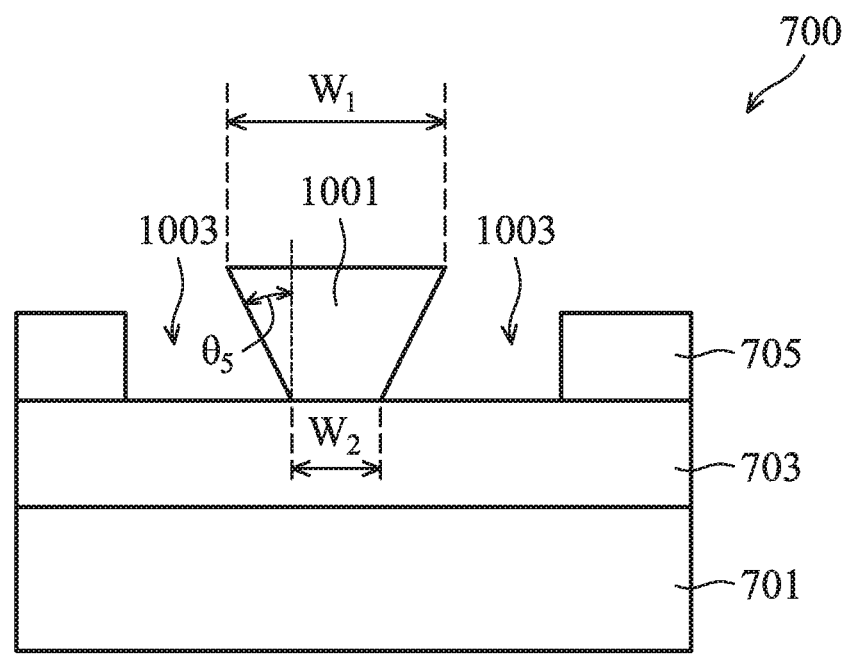

Referring to FIGS. 10A and 10B, after performing the IMP2 901, the mask 803 (see FIGS. 9A and 9B) is removed. In some embodiments, the mask 803 may be removed using, for example, an ashing process, a dry etching process, a wet etching process, a wet clean process, a combination thereof, or the like. Subsequently, the undoped regions of the mask 801 are selectively removed such that the doped regions 811 and 905 remain over the target layer 703. In some embodiments, remaining doped regions 811 and 905 form a cut feature 1001 over the target layer 703. In some embodiments wherein the mask 801 comprises silicon, the undoped regions of the mask 801 are selectively removed using, for example, a wet etching process with HF, NH$_4$OH, or the like. In some embodiments, the cut feature 1001 overlaps with at least one of the openings 707 in a plan view and cuts the respective opening 707 into two separate openings 1003 as illustrated in FIG. 10A. In some embodiments, the cut feature 1001 may have a shape of a trapezoid, with a top base having a width $W_1$ and a bottom base having a width $W_2$. In some embodiments, the width $W_1$ is greater than the width $W_2$. In other embodiments, a ratio of $W_1/W_2$ may be altered according to design characteristics of the resulting semiconductor structure. In some embodiments, a sidewall of the cut feature 1001 forms an angle $\theta_5$ with a direction perpendicular to the top (or the bottom) base of the cut feature 1001. In some embodiments, the angle $\theta_5$ may be between about 5 degrees and about 45 degrees.

Figure 11A:
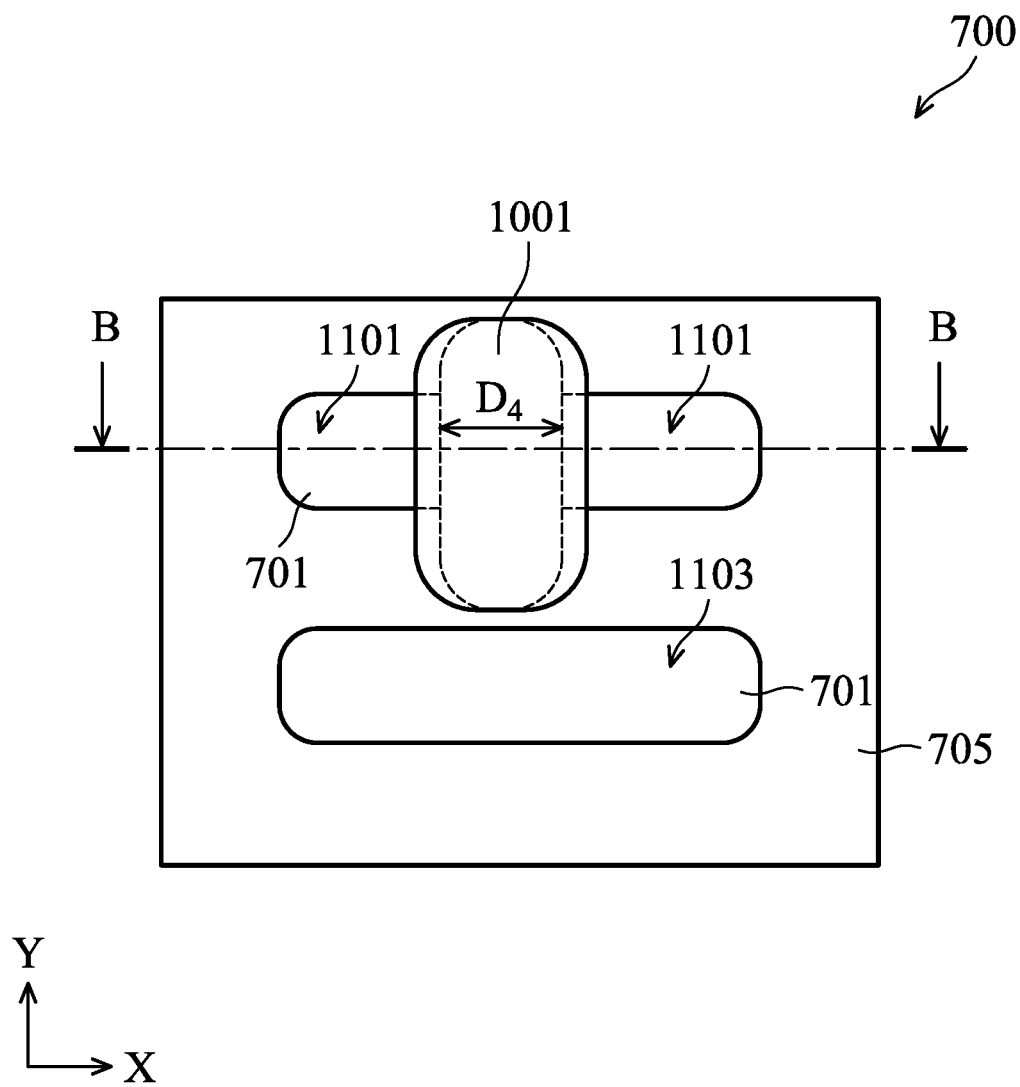
Figure 11B:
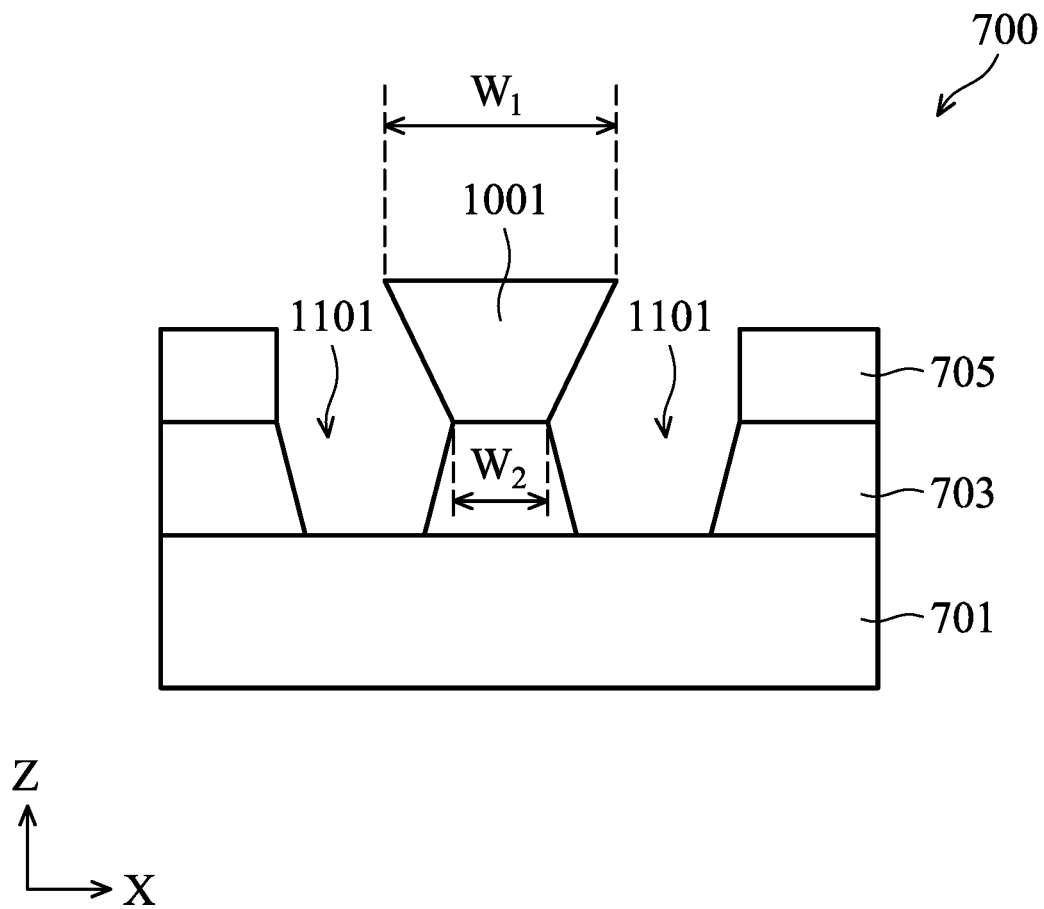

Referring to FIGS. 11A and 11B, the target layer 703 is patterned using the mask 705 and the cut feature 1001 as a combined mask to form openings 1101 and 1103 in the target layer 703. In some embodiments, the target layer 703 may be patterned using a suitable etching process, such as an anisotropic dry etching process, or the like. In some embodiments, the openings 1101 correspond to the openings 1003 (see FIGS. 10A and 10B), and the opening 1103 corresponds to the opening 707 (see FIGS. 10A and 10B). In some embodiments, the openings 1101 have an end-to-end spacing $D_4$. In some embodiments, the end-to-end spacing $D_4$ may substantially equal to the width $W_2$ of the cut feature 1001. In some embodiments, the end-to-end spacing $D_4$ may be between about 5 nm and about 18 nm. In some embodiments, the openings 1101 and 1103 may be filled with a suitable material. In some embodiments where the target layer 703 is an upper portion of the substrate, the openings 1101 and 1103 may be filled with a suitable dielectric material to form isolation regions in the openings 1101 and 1103. In some embodiments where the target layer 703 is an ILD or an IMD, the openings 1101 and 1103 may be filled with a suitable conductive material to form conductive features in the openings 1101 and 1103.

In some embodiments, shape and dimensions of the cut feature 1001 may be varied by varying process parameters for the IMP1 807 (see FIGS. 8A and 8B) and the IMP 901 (see FIGS. 9A and 9B). For example, the cut feature 1001 having a shape of a trapezoid with the width $W_2$ of the bottom base greater than the width $W_1$ of the top base may be formed by performing the IMP2 901 prior to the IMP1 807, such that the IMP1 807 is performed at a lower ion energy than the IMP2 901. In some embodiments, by reducing the width $W_2$ of the bottom base of the cut feature 1001, the end-to-end spacing $D_4$ between the openings 1101 may be reduced. In some embodiments, the width $W_2$ of the bottom base of the cut feature 1001 may be varied by varying process parameters for the IMP1 807 (see FIGS. 8A and 8B) such as, for example, an angle of ions used in the IMP1 807. FIG. 12 illustrates various dimensions of the cut feature 1001 (see FIGS. 11A and 11B) with respective parameters of the IMP1 807 (see FIGS. 8A and 8B) in accordance with some embodiments.

Figure 13:
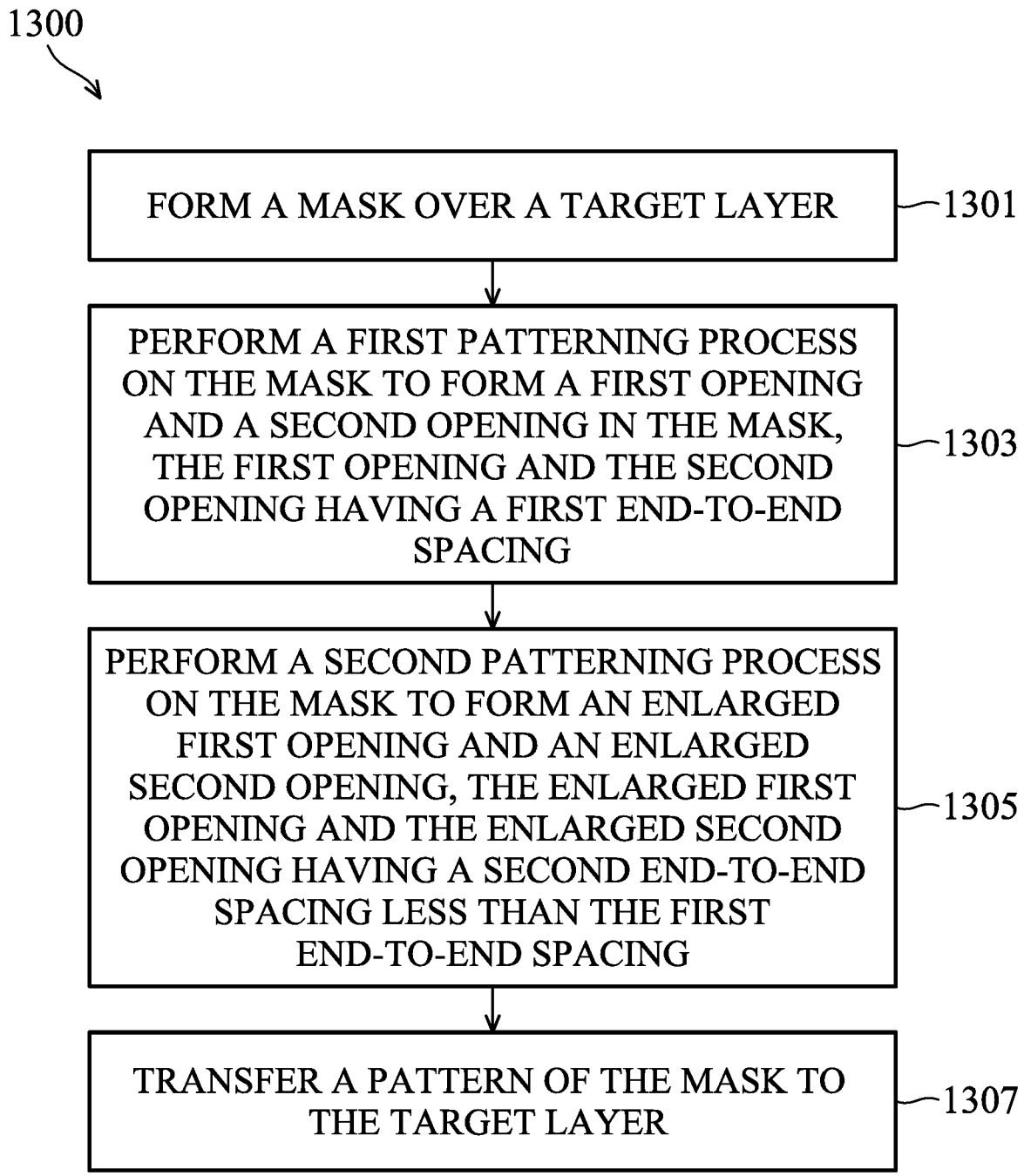
FIG. 13 is a flow diagram illustrating a method of forming a semiconductor structure in accordance with some embodiments.

FIG. 13 is a flow diagram illustrating a method 1300 of forming a semiconductor structure in accordance with some embodiments. The method 1300 starts with step 1301, where a mask (such as the mask 105 illustrated in FIGS. 1A, 1B, and 1C) is formed over a target layer (such as the target layer 103 illustrated in FIGS. 1A, 1B, and 1C) as described above with reference to FIGS. 1A, 1B, and 1C. In step 1303, a first patterning process is performed on the mask to form a first opening and a second opening (such as the openings 201 illustrated in FIGS. 2A, 2B, and 2C) in the mask as described above with reference to FIGS. 1A-2C, with the first opening and the second opening having a first end-to-end distance. In some embodiments, the first patterning process comprises a first etching process, the first etching process being isotropic in a plane parallel to a top surface of the target layer. In step 1305, a second patterning process is performed on the mask to form an enlarged first opening and an enlarged second opening (such as the openings 303 illustrated in FIGS. 3A, 3B, and 3C) in the mask as described above with reference to FIGS. 3A, 3B, and 3C, with the enlarged first opening and the enlarged second opening having a second end-to-end distance less than the first end-to-end distance. In some embodiments, the second patterning process comprises a second etching process, the second etching process being anisotropic in the plane parallel to the top surface of the target layer. In step 1307, a pattern of the mask is transferred to the target layer as described above with reference to FIGS. 4A, 4B, and 4C.

Figure 14:
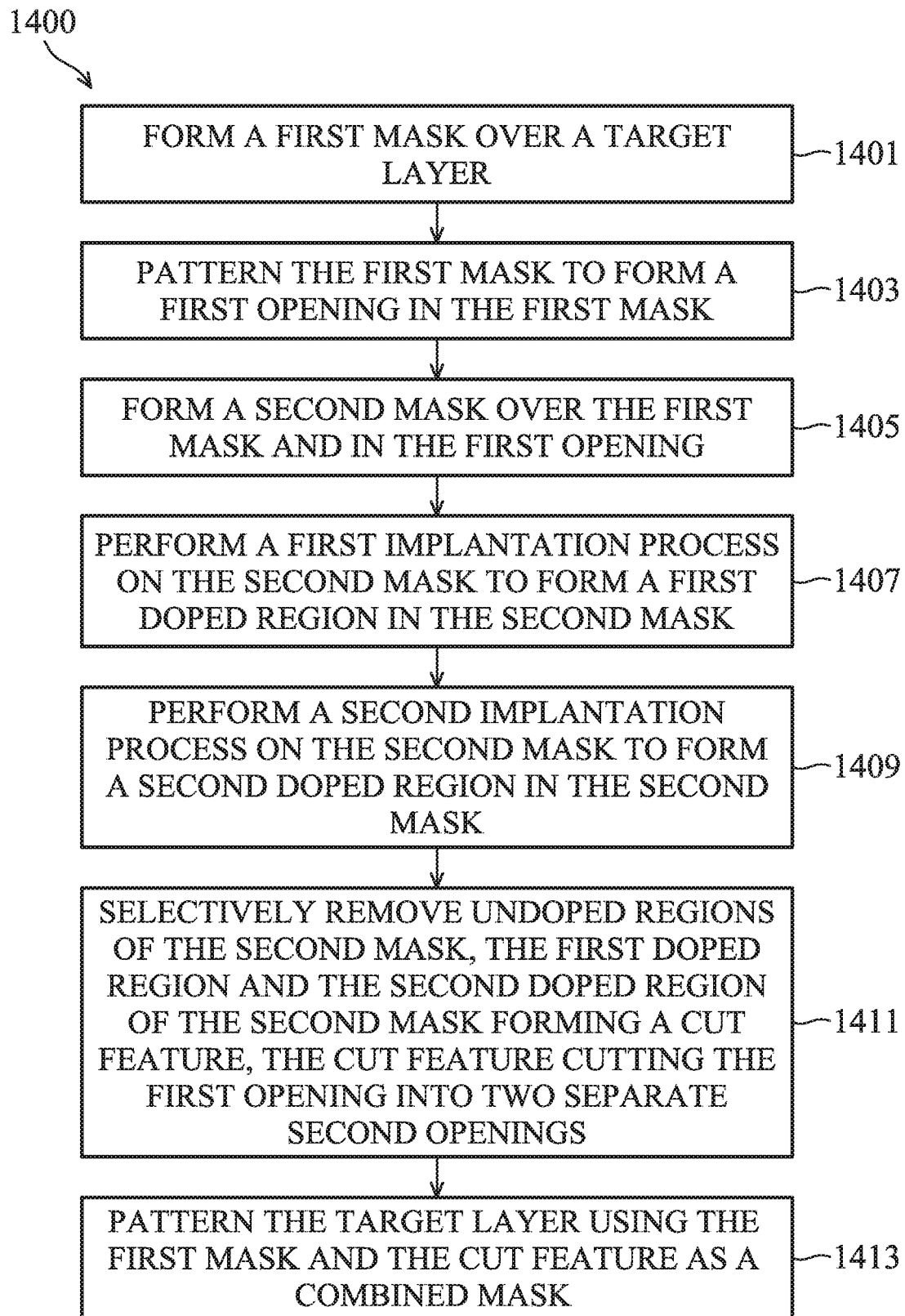
FIG. 14 is a flow diagram illustrating a method of forming a semiconductor structure in accordance with some embodiments.

FIG. 14 is a flow diagram illustrating a method 1400 of forming a semiconductor structure in accordance with some embodiments. The method 1400 starts with step 1401, where a first mask (such as the mask 705 illustrated in FIGS. 7A and 7B) is formed over a target layer (such as the target layer 703 illustrated in FIGS. 7A and 7B) as described above with reference to FIGS. 7A and 7B. In step 1403, the first mask is patterned to form a first opening (such as the opening 707 illustrated in FIGS. 7A and 7B) in the first mask as described above with reference to FIGS. 7A and 7B. In step 1405, a second mask (such as the mask 801 illustrated in FIGS. 8A and 8B) is formed over the first mask and in the first opening as described above with reference to FIGS. 8A and 8B. In step 1407, a first implantation process (such as the IMP1 807 illustrated in FIGS. 8A and 8B) is performed on the second mask to form a first doped region (such as the first doped region 811 illustrated in FIGS. 8A and 8B) in the second mask as described above with reference to FIGS. 8A and 8B. In step 1409, a second implantation process (such as the IMP2 901 illustrated in FIGS. 9A and 9B) is performed on the second mask to form a second doped region (such as the second doped region 905 illustrated in FIGS. 9A and 9B) in the second mask as described above with reference to FIGS. 9A and 9B. In some embodiments, the second doped region is above the first doped region. In some embodiments, a width of the second doped region is greater than a width of the first doped region. In step 1411, undoped regions of the second mask is removed, the first doped region and the second doped region of the second mask forming a cut feature (such as the cut feature 1001 illustrated in FIGS. 10A and 10B) as described above with reference to FIGS. 10A and 10B, with the cut feature cutting the first opening into two separated second openings (such as the openings 1003 illustrated in FIGS. 10A and 10B). In step 1413, the target layer is patterned using the first mask and the cut feature as a combined mask as described above with reference to FIGS. 11A and 11B.

Various embodiments described herein allow for patterning a target layer of a semiconductor structure to form features having a reduced end-to-end spacing. In some embodiments, methods described herein allow for achieving the reduced end-to-end spacing between various features of a semiconductor structure that may not be achievable by using traditional photolithography and etching techniques.

In accordance with an embodiment, a method includes forming a mask layer over a target layer; performing a first etching process on the mask layer to form a first opening and a second opening in the mask layer; performing a second etching process on the mask layer to reduce an end-to-end spacing between the first opening and the second opening, the first etching process and the second etching process having different anisotropy properties; and transferring a pattern of the mask layer to the target layer. In an embodiment, the first etching process is isotropic in a plane parallel to a top surface of the target layer. In an embodiment, the second etching process is anisotropic in the plane parallel to the top surface of the target layer. In an embodiment, the second etching process is performed using a directed plasma ribbon beam. In an embodiment, a direction of ions in the directed plasma ribbon beam forms a non-zero angle with a direction perpendicular to the top surface of the target layer. In an embodiment, after performing the second etching process on the mask layer, the first opening has a first profile in a first plane perpendicular to a top surface of the target layer and a second profile in a second plane perpendicular to the top surface of the target layer, the first profile being different from the second profile, the first plane being different from the second plane. In an embodiment, transferring the pattern of the mask layer to the target layer, comprises etching the target layer using the mask layer as an etch mask.

In accordance with another embodiment, a method includes forming a mask layer over a target layer; performing a first etching process on the mask layer to form a first opening and a second opening in the mask layer, the first etching process being isotropic in a first plane parallel to a top surface of the target layer, the first opening and the second opening having a first end-to-end spacing; performing a second etching process on the mask layer to form an enlarged first opening and an enlarged second opening in the mask layer, the second etching process being anisotropic in the first plane parallel to the top surface of the target layer, the enlarged first opening and the enlarged second opening having a second end-to-end spacing, the first end-to-end spacing being different from the second end-to-end spacing; and etching the target layer using the mask layer as an etch mask. In an embodiment, performing the second etching process on the mask layer comprises using a directed plasma ribbon beam. In an embodiment, a direction of ions in the directed plasma ribbon beam forms a first angle with a direction perpendicular to the top surface of the target layer in a second plane perpendicular to the top surface of the target layer, the direction of the ions in the directed plasma ribbon beam forms a second angle with the direction perpendicular to the top surface of the target layer in a third plane perpendicular to the top surface of the target layer, the first angle is different from the second angle, and the second plane is different from the third plane. In an embodiment, the first angle is greater than zero and the second angle substantially equals to zero. In an embodiment, the first end-to-end spacing is greater than the second end-to-end spacing. In an embodiment, the enlarged first opening has a first profile in a second plane perpendicular to the top surface of the target layer and a second profile in a third plane perpendicular to the top surface of the target layer, the first profile being different from the second profile, the second plane being different from the third plane.

In accordance with yet another embodiment, a method includes forming a first mask layer over a target layer; patterning the first mask layer to form a first opening in the first mask layer; forming a second mask layer over the first mask layer and in the first opening; performing a first implantation process on the second mask layer to form a first doped region in the second mask layer, the first doped region having a first width; performing a second implantation process on the second mask layer to form a second doped region in the second mask layer, the second doped region being above the first doped region, the second doped region having a second width, the second width being different from the first width; selectively removing undoped regions of the second mask layer, the first doped region and the second doped region of the second mask layer forming a cut feature, the cut feature cutting the first opening into two separate second openings; and patterning the target layer using the first mask layer and the cut feature as a combined mask. In an embodiment, a first direction of first ions of the first implantation process forms a non-zero angle with a direction perpendicular to a top surface of the target layer, and a second direction of second ions of the second implantation process forms a zero angle with the direction perpendicular to the top surface of the target layer. In an embodiment, the first implantation process is performed at a first ion energy, the second implantation process is performed at a second ion energy, and the first ion energy is greater than the second ion energy. In an embodiment, selectively removing the undoped regions of the second mask layer comprises selectively etching the undoped regions of the second mask layer. In an embodiment, the second width is greater than the first width. In an embodiment, the cut feature has a shape of a trapezoid in a plane perpendicular to a top surface of the target layer. In an embodiment, a third width of a top base of the trapezoid is greater than a fourth width of a bottom base of the trapezoid.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a mask layer over a target layer;
performing a first etching process on the mask layer to form a first opening and a second opening in the mask layer;
performing a second etching process on the mask layer to reduce an end-to-end spacing between the first opening and the second opening, the first etching process and the second etching process having different anisotropy properties, wherein, after performing the second etching process on the mask layer, the first opening has a first profile in a first plane perpendicular to a top surface of the target layer and a second profile in a second plane perpendicular to the top surface of the target layer, the first profile being different from the second profile, the first plane being different from the second plane; and
transferring a pattern of the mask layer to the target layer.

2. The method of claim 1, wherein the first etching process is isotropic in a plane parallel to the top surface of the target layer.

3. The method of claim 2, wherein the second etching process is anisotropic in the plane parallel to the top surface of the target layer.

4. The method of claim 2, wherein the second etching process is performed using a directed plasma ribbon beam.

5. The method of claim 4, wherein a direction of ions in the directed plasma ribbon beam forms a non-zero angle with a direction perpendicular to the top surface of the target layer.

6. The method of claim 5, wherein the non-zero angle is between about 15 degrees and about 40 degrees.

7. The method of claim 1, wherein transferring the pattern of the mask layer to the target layer, comprises etching the target layer using the mask layer as an etch mask.

8. A method comprising:
forming a mask layer over a target layer;
performing a first etching process on the mask layer to form a first opening and a second opening in the mask layer, the first etching process being isotropic in a first plane parallel to a top surface of the target layer, the first opening and the second opening having a first end-to-end spacing;
performing a second etching process on the mask layer to form an enlarged first opening and an enlarged second opening in the mask layer, the second etching process being anisotropic in the first plane parallel to the top surface of the target layer, the enlarged first opening and the enlarged second opening having a second end-to-end spacing, the first end-to-end spacing being different from the second end-to-end spacing, wherein performing the second etching process on the mask layer comprises using a directed plasma ribbon beam; and
etching the target layer using the mask layer as an etch mask.

9. The method of claim 8, wherein a direction of ions in the directed plasma ribbon beam forms a first angle with a direction perpendicular to the top surface of the target layer in a second plane perpendicular to the top surface of the target layer, wherein the direction of the ions in the directed plasma ribbon beam forms a second angle with the direction perpendicular to the top surface of the target layer in a third plane perpendicular to the top surface of the target layer, wherein the first angle is different from the second angle, and wherein the second plane is different from the third plane.

10. The method of claim 9, wherein the first angle is greater than zero, and wherein the second angle substantially equals to zero.

11. The method of claim 8, wherein the first end-to-end spacing is greater than the second end-to-end spacing.

12. The method of claim 8, wherein the enlarged first opening has a first profile in a second plane perpendicular to the top surface of the target layer and a second profile in a third plane perpendicular to the top surface of the target layer, the first profile being different from the second profile, the second plane being different from the third plane.

13. The method of claim 8, wherein a width of the directed plasma ribbon beam is greater than a width of the first opening and a width of the second opening.

14. A method comprising:
forming a first mask layer over a target layer;
patterning the first mask layer to form a first opening in the first mask layer;
forming a second mask layer over the first mask layer and in the first opening;
performing a first implantation process on the second mask layer to form a first doped region in the second mask layer, the first doped region having a first width;
performing a second implantation process on the second mask layer to form a second doped region in the second mask layer, the second doped region being above the first doped region, the second doped region having a second width, the second width being different from the first width;
selectively removing undoped regions of the second mask layer, the first doped region and the second doped region of the second mask layer forming a cut feature, the cut feature cutting the first opening into two separate second openings; and
patterning the target layer using the first mask layer and the cut feature as a combined mask.

15. The method of claim 14, wherein a first direction of first ions of the first implantation process forms a non-zero angle with a direction perpendicular to a top surface of the target layer, and wherein a second direction of second ions of the second implantation process forms a zero angle with the direction perpendicular to the top surface of the target layer.

16. The method of claim 14, wherein the first implantation process is performed at a first ion energy, wherein the second implantation process is performed at a second ion energy, and wherein the first ion energy is greater than the second ion energy.

17. The method of claim 14, wherein selectively removing the undoped regions of the second mask layer comprises selectively etching the undoped regions of the second mask layer.

18. The method of claim 14, wherein the second width is greater than the first width.

19. The method of claim 14, wherein the cut feature has a shape of a trapezoid in a plane perpendicular to a top surface of the target layer.

20. The method of claim 19, wherein a third width of a top base of the trapezoid is greater than a fourth width of a bottom base of the trapezoid.

* * * * *